US012720984B2

(12) United States Patent
Jang et al.

(10) Patent No.: US 12,720,984 B2
(45) Date of Patent: Aug. 25, 2026

(54) DISPLAY APPARATUS

(71) Applicant: Samsung Display Co., Ltd., Yongin-si (KR)

(72) Inventors: Sumi Jang, Yongin-si (KR); Jisu Na, Yongin-si (KR); Wonmi Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 344 days.

(21) Appl. No.: 18/609,651

(22) Filed: Mar. 19, 2024

(65) Prior Publication Data

US 2024/0324362 A1 Sep. 26, 2024

(30) Foreign Application Priority Data

Mar. 24, 2023 (KR) ........................ 10-2023-0039075
Apr. 26, 2023 (KR) ........................ 10-2023-0054966

(51) Int. Cl.
*H10K 59/131* (2023.01)
*H10K 59/126* (2023.01)
*H10K 102/00* (2023.01)

(52) U.S. Cl.
CPC ......... *H10K 59/131* (2023.02); *H10K 59/126* (2023.02); *H10K 2102/341* (2023.02)

(58) Field of Classification Search
CPC ........................... H10K 59/131; H10K 59/126
See application file for complete search history.

(56) References Cited

U.S. PATENT DOCUMENTS 11,302,767 B2 4/2022 Lee et al.
2022/0069047 A1 3/2022 Yang et al.
2023/0354656 A1 11/2023 Long et al.

FOREIGN PATENT DOCUMENTS

CN 111916486 A 11/2020
CN 113744649 A 12/2021
KR 10-2019-0080563 A 7/2019
KR 10-2021-0036456 A 4/2021

*Primary Examiner* — Matthew L Reames
(74) *Attorney, Agent, or Firm* — Womble Bond Dickinson (US) LLP

(57) ABSTRACT

A display apparatus includes pixel circuits in the display area on one side of a component area, first data lines extending in a first direction and electrically connected to the pixel circuits, horizontal lines extending in a second direction and electrically connected to the first data lines, vertical lines extending in the first direction and electrically connected to the horizontal lines, a first peripheral line electrically connected to one of the vertical lines, above a first layer, and comprising a first portion in a peripheral area outside a display area surrounding the component area, a second peripheral line electrically connected to another one of the vertical lines, above a second layer which is different from the first layer, and comprising a second portion in the peripheral area, and a shield layer comprising a portion between the first and second layers in the peripheral area.

24 Claims, 19 Drawing Sheets

PL2-1 PL2-2
PCL2
PCL1
V
V'
13
DL2-1 DL2-2
CA
SHD
W1
W2
PA
DA
VCL1
VCL2
VCL3
PL3
x
y
z

DISPLAY APPARATUS

CROSS-REFERENCE TO RELATED APPLICATIONS

This application claims priority to, and the benefit of, Korean Patent Application Nos. 10-2023-0039075, filed on Mar. 24, 2023, and 10-2023-0054966, filed on Apr. 26, 2023, in the Korean Intellectual Property Office, the disclosures of which are incorporated by reference herein in their entirety.

BACKGROUND

1. Field

One or more embodiments relate to a display apparatus capable of displaying a high-quality image.

2. Description of the Related Art

In general, in a display apparatus, such as an organic light-emitting display apparatus, thin-film transistors are respectively arranged in (sub-)pixels to control luminance, etc. of each (sub-)pixel. Such thin-film transistors are configured to control the luminance, etc. of corresponding (sub-)pixels in response to transmitted data signals.

SUMMARY

However, such display apparatuses of the related art may be unable to display high-quality images in some areas within display areas.

To solve various problems including the above problem, one or more embodiments include a display apparatus capable of displaying a high-quality image. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display apparatus includes a substrate including a component area, a display area surrounding the component area in plan view, and a peripheral area outside the display area in plan view, a first-first pixel circuit and a first-second pixel circuit in the display area on one side of the component area, a second-first pixel circuit and a second-second pixel circuit in the display area on another side of the component area, a first-first data line in the display area on the one side of the component area, extending in a first direction from the one side of the component area toward the component area, and electrically connected to the first-first pixel circuit, a first-second data line in the display area on the one side of the component area, extending in the first direction, and electrically connected to the first-second pixel circuit, a first horizontal connection line in the display area, extending in a second direction crossing the first direction, and electrically connected to the first-first data line, a second horizontal connection line in the display area, extending in the second direction, and electrically connected to the first-second data line, a first vertical connection line electrically connected to the first horizontal connection line, and extending in the first direction into the peripheral area, a second vertical connection line electrically connected to the second horizontal connection line, and extending in the first direction into the peripheral area, a first peripheral connection line above a first insulating layer, electrically connected to the first vertical connection line, and including a first portion extending in the second direction in the peripheral area, a second peripheral connection line above a second insulating layer, electrically connected to the second vertical connection line, and including a second portion extending in the second direction in the peripheral area, a second-first data line in the display area on the other side of the component area, extending in the first direction to be electrically connected to the first peripheral connection line, and electrically connected to the second-first pixel circuit, a second-second data line in the display area on the other side of the component area, extending in the first direction to be electrically connected to the second peripheral connection line, and electrically connected to the second-second pixel circuit, and a shield layer including a portion between the first insulating layer and the second insulating layer in the peripheral area.

The shield layer may overlap the first peripheral connection line and/or the second peripheral connection line.

The shield layer may overlap the first peripheral connection line and the second peripheral connection line.

The shield layer may overlap the first portion and the second portion.

The second insulating layer may be above the first insulating layer.

The display apparatus may further include a third insulating layer between the first insulating layer and the second insulating layer, and covering the first peripheral connection line.

The shield layer may be between the third insulating layer and the second insulating layer.

The display apparatus may further include a third pixel circuit in the display area to be in the second direction from the component area, a third data line extending in the first direction, and electrically connected to the third pixel circuit, a common voltage supply line in the peripheral area, and electrically connected to an opposite electrode over the display area, and a third vertical connection line extending in the first direction, passing through the third pixel circuit, and electrically connected to the common voltage supply line.

The common voltage supply line and the second peripheral connection line may be at a same layer.

The third vertical connection line and the second peripheral connection line may be at a same layer.

The third vertical connection line and the common voltage supply line may be integrally formed as a single body.

The common voltage supply line may be farther from the display area than the shield layer in plan view.

In plan view, a width of a portion of the shield layer that overlaps the third vertical connection line may be less than a width of a portion of the shield layer that overlaps the first peripheral connection line or the second peripheral connection line.

The display apparatus may further include a second-first driving voltage line in the display area on the other side of the component area, extending in the first direction to be electrically connected to the shield layer, and electrically connected to the second-first pixel circuit, and a second-second driving voltage line in the display area on the other side of the component area, extending in the first direction to be electrically connected to the shield layer, and electrically connected to the second-second pixel circuit.

The display apparatus may further include a driving voltage supply line in the peripheral area on the one side of the component area, a first-first driving voltage line in the display area on the one side of the component area, extending in the first direction to be electrically connected to the driving voltage supply line, and electrically connected to the first-first pixel circuit, and a first-second driving voltage line in the display area on the one side of the component area, extending in the first direction to be electrically connected to the driving voltage supply line, and electrically connected to the first-second pixel circuit.

The shield layer, the first horizontal connection line, and the second horizontal connection line may be at a same layer.

The first-first pixel circuit and the second-first pixel circuit may be in a same column extending in the first direction.

The first-second pixel circuit and the second-second pixel circuit may be in a same column extending in the first direction.

The first-first data line, the first-second data line, the second-first data line, the second-second data line, the first vertical connection line, and the second vertical connection line may be at a same layer.

According to one or more embodiments, a display apparatus includes a substrate including a component area, a display area surrounding the component area in plan view, and a peripheral area outside the display area in plan view, a first pixel circuit and a second pixel circuit in the display area between the component area and the peripheral area, a first data line in the display area between the component area and the peripheral area, extending in a first direction from the component area toward the peripheral area, and electrically connected to the first pixel circuit, a second data line in the display area between the component area and the peripheral area, extending in the first direction, and electrically connected to the second pixel circuit, a first peripheral connection line above a first insulating layer, electrically connected to the first data line, and including a first portion extending in a second direction in the peripheral area, the second direction crossing the first direction, a second peripheral connection line above a second insulating layer, electrically connected to the second data line, and including a second portion extending in the second direction in the peripheral area, and a shield layer including a portion between the first insulating layer and the second insulating layer in the peripheral area.

The shield layer may overlap the first portion and the second portion.

The second insulating layer may be above the first insulating layer.

The display apparatus may further include a third insulating layer between the first insulating layer and the second insulating layer, and covering the first peripheral connection line.

The shield layer may be between the third insulating layer and the second insulating layer.

Other aspects other than those described above will become apparent from the following detailed description, the appended claims, and the accompanying drawings.

BRIEF DESCRIPTION OF THE DRAWINGS

The above and other aspects of embodiments will be more apparent from the following description taken in conjunction with the accompanying drawings, in which.

DETAILED DESCRIPTION

Figure 1:
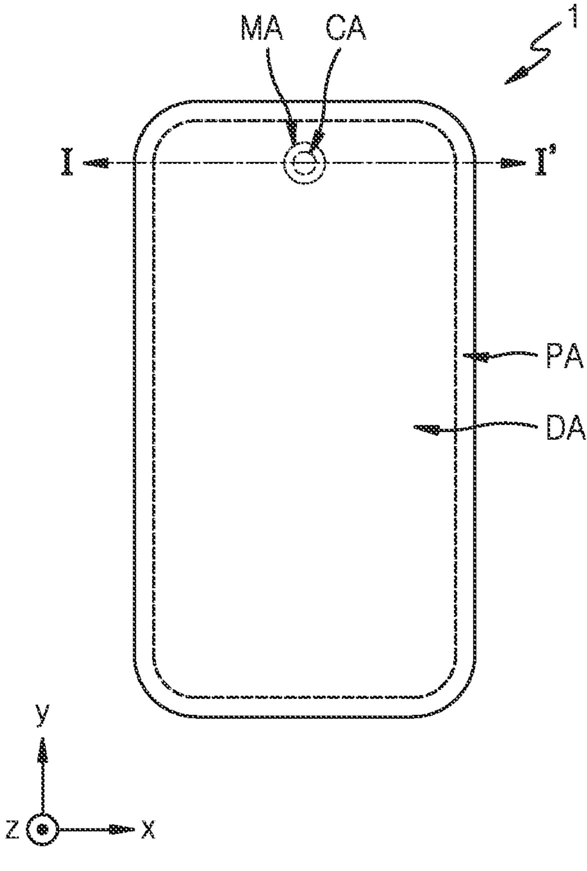
FIG. 1 is a schematic plan view of a display apparatus according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first object and a second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XY, YZ, and XZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms “first,” “second,” etc. may also be used herein to differentiate different categories or sets of elements. For conciseness, the terms “first,” “second,” etc. may represent “first-category (or first-set),” “second-category (or second-set),” etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms “a” and “an” are intended to include the plural forms as well, while the plural forms are also intended to include the singular forms, unless the context clearly indicates otherwise. It will be further understood that the terms “comprises,” “comprising,” “have,” “having,” “includes,” and “including,” when used in this specification, specify the presence of the stated features, integers, steps, operations, elements, and/or components, but do not preclude the presence or addition of one or more other features, integers, steps, operations, elements, components, and/or groups thereof.

As used herein, the term “substantially,” “about,” “approximately,” and similar terms are used as terms of approximation and not as terms of degree, and are intended to account for the inherent deviations in measured or calculated values that would be recognized by those of ordinary skill in the art. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within +30%, 20%, 10%, 5% of the stated value. Further, the use of “may” when describing embodiments of the present disclosure refers to “one or more embodiments of the present disclosure.”

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display apparatus 1 according to one or more embodiments. The display apparatus 1 may be implemented as an electronic apparatus, such as a smartphone, a mobile phone, a navigation apparatus, a game console, a television (TV), a vehicle head unit, a notebook computer, a laptop computer, a tablet computer, a personal media player (PMP), or a personal digital assistant (PDA). Further, the display apparatus 1 may be used as a center information display (CID) arranged on an instrument panel of a vehicle, a center fascia, or a dashboard of a vehicle, a room mirror display functioning in place of a side mirror of a vehicle, or an electronic apparatus arranged on the back of a front seat as an entertaining element for a rear seat of a vehicle. Also, the electronic apparatus may include a flexible apparatus. FIG. 1 illustrates, as an example, a case in which the display apparatus 1 is a smartphone.

The display apparatus 1 may include a display area DA, and a peripheral area PA outside the display area DA. When the display area DA is viewed in a plan view, the display area DA may have a substantially rectangular shape as shown in FIG. 1. However, one or more embodiments are not limited thereto, and the display area DA may have a polygonal shape, such as a triangular shape, a pentagonal shape, or a hexagonal shape, a circular shape, an elliptical shape, or an atypical shape. Corners of an edge of the display area DA may have a round shape. The peripheral area PA may be a type of non-display area in which display elements are not arranged. The display area DA may be entirely surrounded by the peripheral area PA (e.g., in plan view).

Pixels including various display elements, such as an organic light-emitting diode (OLED), may be arranged in the display area DA. The pixels may be arranged in various forms, such as a stripe arrangement, a Pentile arrangement, or a mosaic arrangement, in an x-axis direction and a y-axis direction to display an image.

A component area CA may be positioned in the display area DA. The component area CA may be defined by an opening of a substrate 100 (see FIGS. 3 and 15) included in the display apparatus 1. As shown in FIG. 1, the component area CA may be positioned at the upper center of the display area DA, and the display area DA positioned outside the component area CA may have a shape surrounding the component area CA. The component area CA may be positioned in the display area DA in various manners, such as being positioned on the upper left side of the display area DA, or positioned on the upper right side of the display area DA. Although FIG. 1 illustrates than one component area CA is positioned in the display area DA, the display apparatus 1 may also include a plurality of component areas CA.

An intermediate area MA may be between the display area DA and the component area CA. The intermediate area MA may have a closed loop shape entirely surrounding the component area CA on a plan view.

Figure 2:
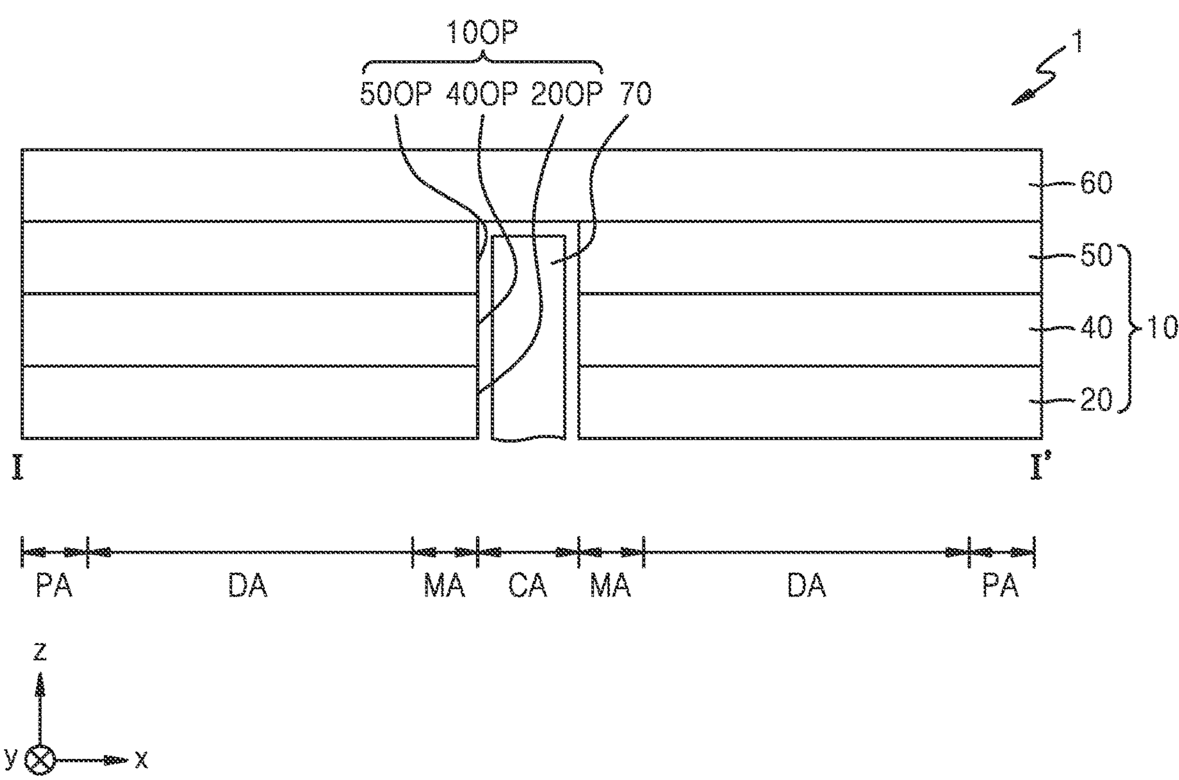
FIG. 2 is a schematic cross-sectional view of the display apparatus of FIG. 1, taken along the line I-I'.

FIG. 2 is a schematic cross-sectional view of the display apparatus 1 of FIG. 1, taken along the line I-I'. As described above, the display apparatus 1 may include a display panel 10, and a component 70 arranged in the component area CA of the display panel 10. The display panel 10 and the component 70 may be accommodated in a housing. The display apparatus 1 may further include a cover window 60.

The display panel 10 may include an image generation layer 20, an input-sensing layer 40, and an optical functional layer 50.

The image generation layer 20 may include display elements (or light-emitting elements) that emit light to display an image. A display element may include a light-emitting diode, for example, an organic light-emitting diode including an organic emission layer. The display element may also include an inorganic light-emitting diode including an inorganic material. The inorganic light-emitting diode may include a PN junction diode including inorganic semiconductor-based materials. If a voltage is applied to a PN junction diode in a forward direction, holes and electrons are injected, and energy generated by recombination of the holes and the electrons is converted into light energy, to emit light of a corresponding color. The aforementioned inorganic light-emitting diode may have a width of several to hundreds of micrometers or several to several hundreds of nanometers.

However, one or more embodiments are not limited thereto. For example, the image generation layer 20 may include a quantum dot layer. That is, light having a wavelength belonging to a corresponding wavelength band generated in an emission layer included in the image generation layer 20 may be converted into light having a corresponding wavelength by the quantum dot layer.

The input-sensing layer 40 may obtain coordinate information according to an external input, for example, a touch event. The input-sensing layer 40 may include a sensing electrode (or a touch electrode) and trace lines connected to the sensing electrode. The input-sensing layer 40 may sense an external input by using a mutual-capacitance method and/or a self-capacitance method.

The input-sensing layer 40 may be located on the image generation layer 20. The input-sensing layer 40 may be directly formed on the image generation layer 20, or may be separately formed and attached to the image generation layer 20 through an adhesive layer, such as an optically clear adhesive (OCA). In the former case, the input-sensing layer 40 may be continuously formed after a process of forming the image generation layer 20, and in this case, the adhesive layer may not be between the input-sensing layer 40 and the image generation layer 20. For reference, although FIG. 2 illustrates that the input-sensing layer 40 is between the image generation layer 20 and the optical functional layer 50, various modifications may be made. The input-sensing layer 40 may be located on the optical functional layer 50.

The optical functional layer 50 may include an anti-reflective layer. The anti-reflective layer may reduce reflectance of light (external light) incident from the outside toward the display panel 10 through the cover window 60. The anti-reflective layer may include a phase retardation film and a polarizing film. Alternatively, the anti-reflective layer may include a black matrix and color filters. In the latter case, the color filters may be arranged in consideration of the color of light emitted from the image generation layer 20.

The display panel 10 may include an opening 10OP to improve transmittance of the component area CA. Because the display panel 10 includes the opening 10OP, a substrate 100, which is an element of the image generation layer 20 included in the display panel 10, may also include such an opening as described above. The opening 10OP may include a first opening 20OP passing through the image generation layer 20, a second opening 40OP passing through the input-sensing layer 40, and a third opening 50OP passing through the optical functional layer 50. That is, the first opening 20OP passing through the image generation layer 20, the second opening 40OP passing through the input-sensing layer 40, and the third opening 50OP passing through the optical functional layer 50 may overlap each other to form the opening 10OP of the display panel 10.

The cover window 60 may be located on the optical functional layer 50. The cover window 60 may be attached to the optical functional layer 50 through an adhesive layer, such as an OCA. The cover window 60 may cover the first opening 20OP passing through the image generation layer 20, the second opening 40OP passing through the input-sensing layer 40, and the third opening 50OP passing through the optical functional layer 50. The cover window 60 may include glass or plastic. If the cover window 60 includes glass, the cover window 60 may include ultra-thin glass. If the cover window 60 includes plastic, the cover window 60 may include polyethersulfone, polyacrylate, polyetherimide, polyethylene naphthalate, polyethylene terephthalate, polyphenylene sulfide, polyarylate, polyimide, polycarbonate, or cellulose acetate propionate.

The component area CA may be a type of component area (e.g., a sensor area, a camera area, or a speaker area) in which the component 70 for adding various functions to the display apparatus 1 is positioned.

The component 70 that is an electronic element may be arranged (in a −z direction) corresponding to the component area CA. The component 70 may include a camera or sensor that is an electronic element using light or sound. In this case, sensors may include a proximity sensor that measures a distance or an illuminance sensor that measures brightness. The electronic element using light may use light of various wavelength bands, such as visible light, infrared light, or ultraviolet light. The component area CA may allow light or/and sound to be output from the component 70 to the outside or allow light or/and sound from the outside to travel toward the component 70.

Figure 3:
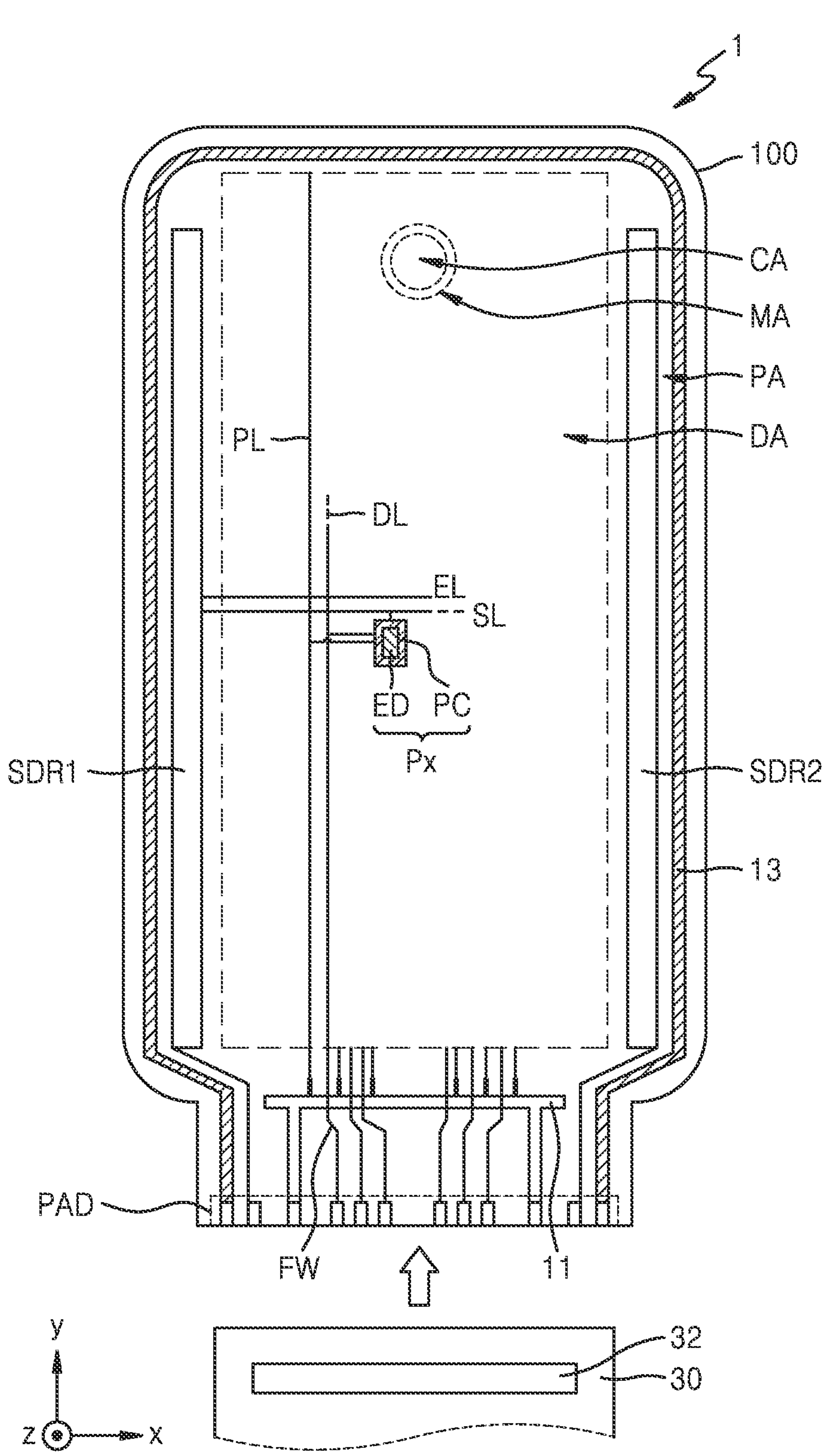
FIG. 3 is a schematic plan view of a display panel that may be included in the display apparatus of FIG. 1.

FIG. 3 is a schematic plan view of the display panel 10 included in the display apparatus 1 of FIG. 1.

A plurality of pixels Px are arranged in the display area DA. Each of the pixels Px may include a display element ED, such as an organic light-emitting diode OLED (e.g. refer to FIG. 5). Each of the pixels Px includes a pixel circuit PC configured to control the display element ED. The pixel circuit PC may be arranged to overlap the display element ED. Each of the pixels Px may emit, for example, red, green, blue, or white light. The display area DA may be protected from external air or moisture by being covered by an encapsulation member.

The intermediate area MA surrounding the component area CA may be between the display area DA and the component area CA, as may be suitable. If suitable, the pixels Px may also be arranged in the intermediate area MA. In this case, the number of pixels Px per unit area in the intermediate area MA may be less than the number of pixels Px per unit area in the display area DA.

Each of pixel circuits PC included in the pixels Px on the display area DA may be electrically connected to outer circuits arranged in the peripheral area PA. A first scan-driving circuit SDR1, a second scan-driving circuit SDR2, a terminal portion PAD, a driving voltage supply line 11, and a common voltage supply line 13 may be arranged in the peripheral area PA.

The first scan-driving circuit SDR1 may be arranged on one side of the display area DA (in a −x direction). The second scan-driving circuit SDR2 may be arranged symmetrically with the first scan-driving circuit SDR1 with respect to the display area DA. The first scan-driving circuit SDR1 may be connected to some of the pixel circuits PC through a scan line SL, and may be configured to apply a scan signal. The second scan-driving circuit SDR2 may be connected to the others of the pixel circuits PC through a scan line, and may be configured to apply a scan signal. The first scan-driving circuit SDR1 may be connected to some of the pixel circuits PC through an emission control line EL, and may be configured to apply an emission control signal. The second scan-driving circuit SDR2 may be connected to the others of the pixel circuits PC through an emission control line, and may be configured to apply an emission control signal.

The terminal portion PAD may be arranged on one side of the substrate 100. The terminal portion PAD may be exposed by not being covered by an insulating layer, and may be connected to a display circuit board 30. A display driver 32 may be arranged in the display circuit board 30.

The display driver 32 may be configured to generate a control signal transmitted to the first scan-driving circuit SDR1 and the second scan-driving circuit SDR2. Also, the display driver 32 may be configured to generate a data signal, and the generated data signal may be transmitted to the pixel circuit PC through a fan-out wire FW, and through a data line DL connected to the fan-out wire FW.

The display driver 32 may be configured to supply a driving voltage ELVDD (e.g. refer to FIG. 5) to the driving voltage supply line 11, and may be configured to supply a common voltage ELVSS (e.g. refer to FIG. 5) to the common voltage supply line 13. The driving voltage ELVDD may be applied to the pixel circuit PC through a driving voltage line PL that is connected to the driving voltage supply line 11, and extends substantially in a first direction (y-axis direction). The common voltage ELVSS may be applied to an opposite electrode of the display element ED electrically connected to the common voltage supply line 13.

The driving voltage supply line 11 may extend from the lower side of the display area DA in a second direction (x-axis direction) crossing the first direction (y-axis direction). The common voltage supply line 13 may have a loop shape having one side open to partially surround the display area DA (e.g., in plan view).

Figure 4:
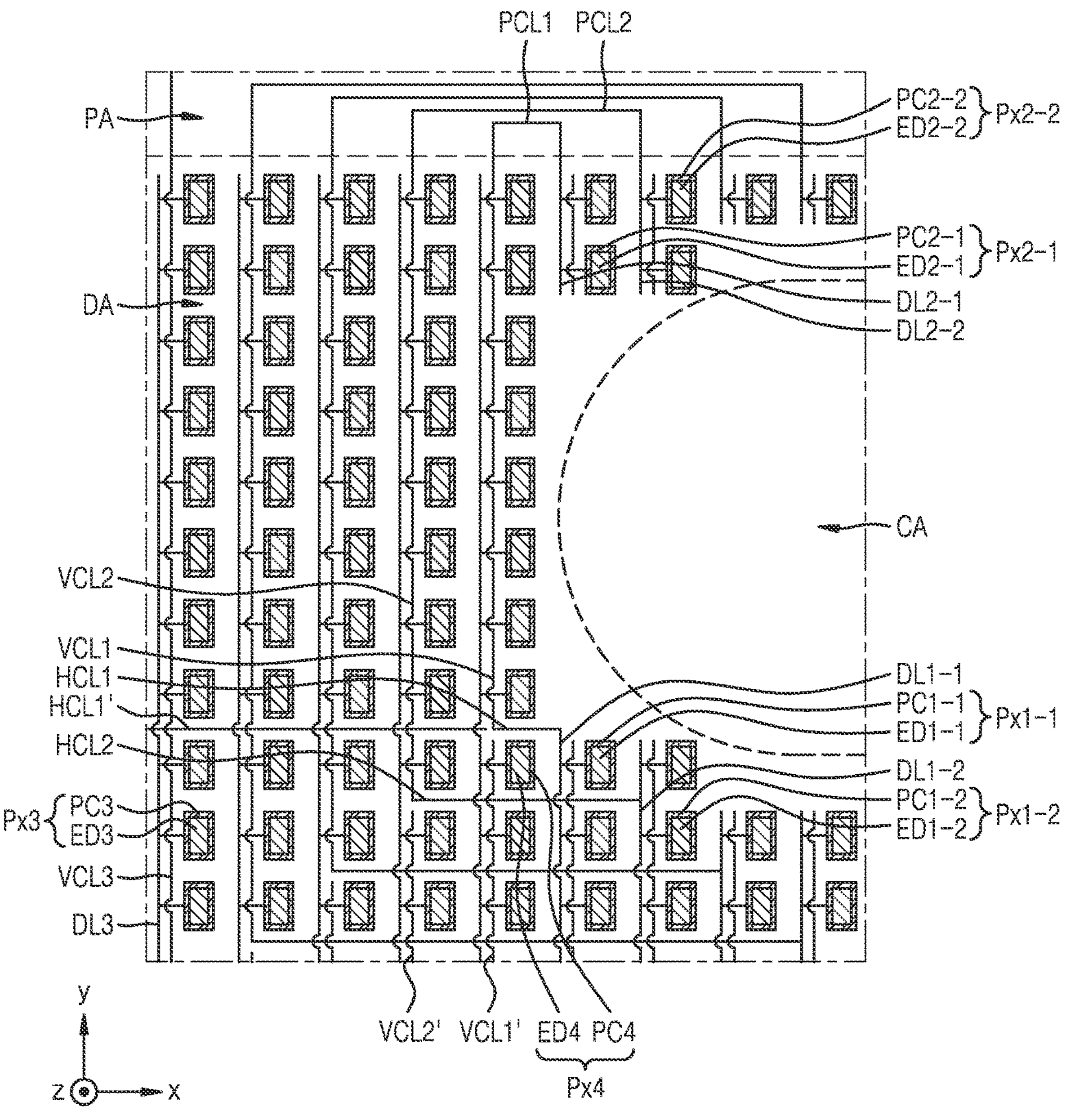
FIG. 4 is a schematic conceptual diagram of a region of the display panel of FIG. 3.

FIG. 4 is a schematic conceptual diagram of a region of the display panel 10 of FIG. 3. As shown in FIG. 4, a plurality of pixels are arranged in the display area DA. For example, a first-first pixel Px1-1 is arranged on one side of the component area CA (in a −y direction), the first-first pixel Px1-1 including a first-first pixel circuit PC1-1 and a first-first display element ED1-1 electrically connected to the first-first pixel circuit PC1-1. A first-second pixel Px1-2 is also arranged on one side of the component area CA (in the −y direction), the first-second pixel Px1-2 including a first-second pixel circuit PC1-2 and a first-second display element ED1-2 electrically connected to the first-second pixel circuit PC1-2. The first-first pixel circuit PC1-1 and the first-first display element ED1-1 may be arranged to overlap each other as shown in FIG. 4, and the first-second pixel circuit PC1-2 and the first-second display element ED1-2 may also be arranged to overlap each other as shown in FIG. 4.

A second-first pixel Px2-1 is arranged on the other side of the component area CA (in the +y direction), the second-first pixel Px2-1 including a second-first pixel circuit PC2-1 and a second-first display element ED2-1 electrically connected to the second-first pixel circuit PC2-1. A second-second pixel Px2-2 is also arranged on the other side of the component area CA (in the +y direction), the second-second pixel Px2-2 including a second-second pixel circuit PC2-2 and a second-second display element ED2-2 electrically connected to the second-second pixel circuit PC2-2. The second-first pixel circuit PC2-1 and the second-first display element ED2-1 may be arranged to overlap each other as shown in FIG. 4, and the second-second pixel circuit PC2-2 and the second-second display element ED2-2 may also be arranged to overlap each other as shown in FIG. 4.

A first-first data line DL1-1 extending in the first direction (y-axis direction) from one side of the component area CA (in the −y direction) toward the component area CA is arranged in the display area DA to be on one side of the component area CA (in the −y direction), and is electrically connected to the first-first pixel circuit PC1-1. Pixels arranged in the display area DA to be on one side of the component area CA (in the −y direction) and belonging to the same column as the first-first pixel Px1-1 may also be electrically connected to the first-first data line DL1-1.

Similarly, a first-second data line DL1-2 extending in the first direction (y-axis direction) from one side of the component area CA (in the −y direction) toward the component area CA is arranged in the display area DA to be on one side of the component area CA (in the −y direction) and is electrically connected to the first-second pixel circuit PC1-2. Pixels arranged in the display area DA to be on one side of the component area CA (in the −y direction) and belonging to the same column as the first-second pixel Px1-2 may also be electrically connected to the first-second data line DL1-2.

Moreover, a second-first data line DL2-1 extending in the first direction (y-axis direction) may be arranged in the display area DA to be on the other side of the component area CA (in a +y direction), and may be electrically connected to the second-first pixel circuit PC2-1. Pixels arranged in the display area DA to be on the other side of the component area CA (in the +y direction) and belonging to the same column as the second-first pixel Px2-1 may also be electrically connected to the second-first data line DL2-1. The second-first pixel Px2-1 and the first-first pixel Px1-1 may be arranged in the same column. This means that the second-first pixel circuit PC2-1 and the first-first pixel circuit PC1-1 are arranged in the same column. Accordingly, an extension axis in the first direction (y-axis direction) of the second-first data line DL2-1 may match an extension axis in the first direction (y-axis direction) of the first-first data line DL1-1.

Similarly, a second-second data line DL2-2 extending in the first direction (y-axis direction) may be arranged in the display area DA to be on the other side of the component area CA (in the +y direction) and may be electrically connected to the second-second pixel circuit PC2-2. Pixels arranged in the display area DA to be on the other side of the component area CA (in the +y direction), and belonging to the same column as the second-second pixel Px2-2, may also be electrically connected to the second-second data line DL2-2. The second-second pixel Px2-2 and the first-second pixel Px1-2 may be arranged in the same column. This means that the second-second pixel circuit PC2-2 and the first-second pixel circuit PC1-2 are arranged in the same column. Accordingly, an extension axis in the first direction (y-axis direction) of the second-second data line DL2-2 may match an extension axis in the first direction (y-axis direction) of the first-second data line DL1-2.

The first-first data line DL1-1 and the second-first data line DL2-1 may be electrically connected to each other. In detail, the first-first data line DL1-1 and the second-first data line DL2-1 may be electrically connected to each other through a first horizontal connection line HCL1, a first vertical connection line VCL1, and a first peripheral connection line PCL1.

The first horizontal connection line HCL1 is arranged in the display area DA to be on one side of the component area CA (in the −y direction), and extends in the second direction (x-axis direction) crossing the first direction. One end of the first horizontal connection line HCL1 is electrically connected to the first-first data line DL1-1. The first vertical connection line VCL1 may be electrically connected to the other end of the first horizontal connection line HCL1, and may extend in the first direction (y-axis direction) into the peripheral area PA outside the display area DA. One end of the first peripheral connection line PCL1 is electrically connected to the first vertical connection line VCL1 from the other side of the component area CA, and includes a first portion extending substantially in the second direction (x-axis direction) from the peripheral area PA. The other end of the first peripheral connection line PCL1 is electrically connected to the second-first data line DL2-1.

The display apparatus 1 as described above may be configured to apply, through the first-first data line DL1-1 and the second-first data line DL2-1 electrically connected to each other as described above, a data signal to pixels belonging to the same column extending in the first direction (y-axis direction), including the first-first pixel Px1-1 and the second-first pixel Px2-1, which are electrically connected to the first-first data line DL1-1 and the second-first data line DL2-1, respectively.

The first-second data line DL1-2 and the second-second data line DL2-2 may be electrically connected to each other. In detail, the first-second data line DL1-2 and the second-second data line DL2-2 may be electrically connected to each other through a second horizontal connection line HCL2, a second vertical connection line VCL2, and a second peripheral connection line PCL2.

The second horizontal connection line HCL2 is arranged in the display area DA to be on one side of the component area CA (in the −y direction), and extends in the second direction (x-axis direction) crossing the first direction. One end of the second horizontal connection line HCL2 is electrically connected to the first-second data line DL1-2. The second vertical connection line VCL2 may be electrically connected to the other end of the second horizontal connection line HCL2, and may extend in the first direction (y-axis direction) into the peripheral area PA outside the display area DA. One end of the second peripheral connection line PCL2 is electrically connected to the second vertical connection line VCL2 from the other side of the component area CA, and includes a second portion extending substantially in the second direction (x-axis direction) from the peripheral area PA. The other end of the second peripheral connection line PCL2 is electrically connected to the second-second data line DL2-2.

The display apparatus 1 as described above may be configured to apply, through the first-second data line DL1-2 and the second-second data line DL2-2 electrically connected to each other as described above, a data signal to pixels belonging to the same column extending in the first direction (y-axis direction), including the first-second pixel Px1-2 and the second-second pixel Px2-2, which are electrically connected to the first-second data line DL1-2 and the second-second data line DL2-2, respectively.

Moreover, as shown in FIG. 4, a third pixel Px3 may be arranged in the display area DA. A column in which the third pixel Px3 is arranged may be different from a column in which the first-first pixel Px1-1 and the second-first pixel Px2-1 are arranged, and may also be different from a column in which the first-second pixel Px1-2 and the second-second pixel Px2-2 are arranged. The third pixel Px3 including a third display element ED3 electrically connected to a third pixel circuit PC3 is arranged in the display area DA to be positioned in the second direction (x-axis direction) from the component area CA. The third pixel circuit PC3 and the third display element ED3 may be arranged to overlap each other.

A third data line DL3 extending in the first direction (y-axis direction) is electrically connected to the third pixel circuit PC3. Pixels arranged in the display area DA to be in the second direction (x-axis direction) from the component area CA, and belonging to the same column as the third pixel Px3 may also be electrically connected to the third data line DL3. Because the third data line DL3 is not disconnected by the component area CA, all of the pixels belonging to the same column as the third pixel Px3 may be directly electrically connected to the third data line DL3 without using a peripheral connection line, such as in a manner similar to the first peripheral connection line PCL1 or the second peripheral connection line PCL2. For reference, an end of the third data line DL3 in the first direction (y-axis direction) may extend to the peripheral area PA outside the display area DA. This also applies to other data lines described above.

In addition, a third vertical connection line VCL3 extending in the first direction (y-axis direction) may pass through pixels belonging to the same column as the third pixel Px3. The third vertical connection line VCL3 is not connected to other data lines. That is, the third vertical connection line VCL3 is not used to electrically connect data lines spaced apart from each other in the +y and −y directions of the component area CA in the first direction (y-axis direction). Accordingly, the third vertical connection line VCL3 may not be present, but the third vertical connection line VCL3 may be present, such that a pixel structure of pixels including a vertical connection line is the same as, or similar to, a pixel structure of pixels belonging to the same column as the third pixel Px3. Accordingly, a display apparatus that displays a higher quality image may be implemented. The third vertical connection line VCL3 may be arranged adjacent to, and substantially parallel to, the third data line DL3, and may have a shape extending in the first direction (y-axis direction).

Like the third pixel Px3, a fourth pixel Px4 including a fourth pixel circuit PC4 and a fourth display element ED4 electrically connected to the fourth pixel circuit PC4 may be arranged in the display area DA. A column in which the fourth pixel Px4 is arranged may be a column in which the first vertical connection line VCL1 is arranged, the first vertical connection line VCL1 electrically connecting the first-first data line DL1-1, which is configured to supply a data signal to the first-first pixel Px1-1, to the second-first data line DL2-1, which is configured to supply a data signal to the second-first pixel Px2-1. However, the first vertical connection line VCL1 may not pass through the fourth pixel Px4, but a first dummy vertical connection line VCL1' spaced apart from the first vertical connection line VCL1 may pass through the fourth pixel Px4. That is, a vertical connection line extending in the first direction (y-axis direction) to pass through the fourth pixel Px4 may include the first vertical connection line VCL1 and the first dummy vertical connection line VCL1', which are spaced apart from each other. This also applies to other columns. For example, even for a column arranged in a −x direction of the first dummy vertical connection line VCL1', a vertical connection line extending in the first direction (y-axis direction) may include the second vertical connection line VCL2 and a second dummy vertical connection line VCL2', which are spaced apart from each other.

As described above, the first vertical connection line VCL1 electrically connects the first-first data line DL1-1 to the second-first data line DL2-1, and the second vertical connection line VCL2 electrically connects the first-second data line DL1-2 to the second-second data line DL2-2. For pixels that are positioned in columns in which the first vertical connection line VCL1 or the second vertical connection line VCL2 is arranged, but with the first vertical connection line VCL1 or the second vertical connection line VCL2 not passing therethrough, a vertical connection line may not be present in those pixels. However, in this case, a structure of pixels through which the first vertical connection line VCL1 or the second vertical connection line VCL2 passes, and a structure of pixels through which the first vertical connection line VCL1 or the second vertical connection line VCL2 does not pass, may be different from each other. This may cause a problem that a uniform and high-quality image is not displayed on the display apparatus. In one or more embodiments, the first dummy vertical connection line VCL1' or the second dummy vertical connection line VCL2' passes through the pixels that are positioned in the columns in which the first vertical connection line VCL1 or the second vertical connection line VCL2 is arranged, but without the first vertical connection line VCL1 or the second vertical connection line VCL2 passing therethrough. Therefore, all of the pixels may have substantially the same structure.

This also applies to horizontal connection lines extending in the second direction (x-axis direction). FIG. 4 illustrates that a horizontal connection line passing through a row in which the fourth pixel Px4 is positioned includes the first horizontal connection line HCL1 and a first dummy horizontal connection line HCL1', which are spaced apart from each other. Although other dummy horizontal connection lines are not shown in FIG. 4 for convenience of description, a horizontal connection line passing through a row in which the second horizontal connection line HCL2 is arranged may also include, in addition to the second horizontal connection line HCL2, a second dummy horizontal connection line spaced apart from the second horizontal connection line HCL2. This also applies to other rows.

The first peripheral connection line PCL1 and the second peripheral connection line PCL2 may be arranged on (or at) different layers. That is, the first peripheral connection line PCL1 may be located on a first insulating layer, and the second peripheral connection line PCL2 may be located on a second insulating layer, which is different from the first insulating layer. For example, the second insulating layer may be located on the first insulating layer to cover the first peripheral connection line PCL1. As described above, a shield layer SHD (see FIGS. 18 and 19) may be between the first portion of the first peripheral connection line PCL1 in the peripheral area PA and the second portion of the second peripheral connection line PCL2 in the peripheral area PA, which are located on different layers. That is, the shield layer SHD may be between the first insulating layer and the second insulating layer.

As described above, the first peripheral connection line PCL1 electrically connects the first-first data line DL1-1 and the second-first data line DL2-1, which are positioned in the same column. The second peripheral connection line PCL2 also electrically connects the first-second data line DL1-2 and the second-second data line DL2-2, which are positioned in the same column. That is, a data signal supplied through the second-first data line DL2-1 to the second-first pixel Px2-1 electrically connected thereto is supplied through the first peripheral connection line PCL1, and a data signal supplied through the second-second data line DL2-2 to the second-second pixel Px2-2 electrically connected thereto is supplied through the second peripheral connection line PCL2.

Accordingly, if a distance between the first peripheral connection line PCL1 and the second peripheral connection line PCL2 is relatively short, the data signal supplied to the second-first pixel Px2-1 through the first peripheral connection line PCL1 may be affected by the data signal supplied to the second-second pixel Px2-2 through the second peripheral connection line PCL2. Similarly, the data signal supplied to the second-second pixel Px2-2 through the second peripheral connection line PCL2 may be affected by the data signal supplied to the second-first pixel Px2-1 through the first peripheral connection line PCL1. That is, if the distance between the first peripheral connection line PCL1 and the second peripheral connection line PCL2 is relatively short, the first peripheral connection line PCL1 and the second peripheral connection line PCL2 may be electrically coupled to each other, and thus, the display apparatus may not be able to display a high-quality image.

However, as described above, in the display apparatus 1 according to one or more embodiments the shield layer SHD may be between the first portion of the first peripheral connection line PCL1 in the peripheral area PA and the second portion of the second peripheral connection line PCL2 in the peripheral area PA, which are located on different layers. That is, the shield layer SHD may be between the first insulating layer and the second insulating layer. Accordingly, the shield layer SHD may efficiently prevent or significantly reduce electrical coupling between the first peripheral connection line PCL1 and the second peripheral connection line PCL2. Accordingly, the display apparatus 1 may display a high-quality image.

Figure 5:
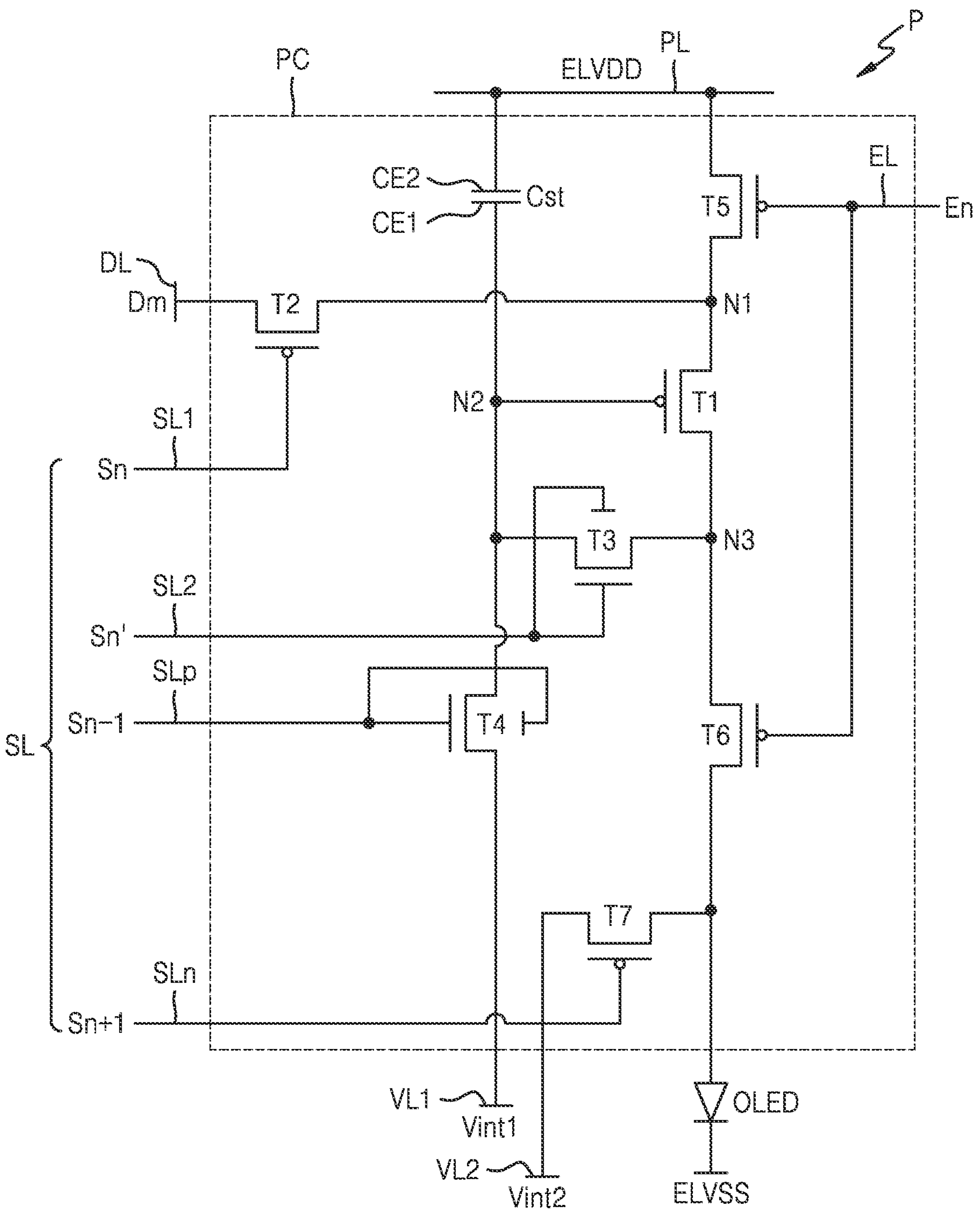
FIG. 5 is an equivalent circuit diagram of a pixel included in the display apparatus of FIG. 1.

FIG. 5 is an equivalent circuit diagram of a pixel P included in the display apparatus 1 of FIG. 1. In this case, the pixel P may refer to the first-first pixel Px1-1, the first-second pixel Px1-2, the second-first pixel Px2-1, the second-second pixel Px2-2, or the third pixel Px3.

As shown in FIG. 5, the pixel P may include a pixel circuit PC and an organic light-emitting diode OLED electrically connected thereto.

As shown in FIG. 5, the pixel circuit PC may include a plurality of thin-film transistors T1 to T7 and a storage capacitor Cst. The plurality of thin-film transistors T1 to T7 and the storage capacitor Cst may be connected to signal lines SL1, SL2, SLp, SLn, EL, and DL, to a first initialization voltage line VL1, to a second initialization voltage line VL2, and to a driving voltage line PL. At least one of the lines (wires), for example, the driving voltage line PL, may be shared between neighboring pixels P.

The plurality of thin-film transistors T1 to T7 may include a driving transistor T1, a switching transistor T2, a compensation transistor T3, a first initialization transistor T4, an operation control transistor T5, an emission control transistor T6, and a second initialization transistor T7.

The organic light-emitting diode OLED may include a pixel electrode (which may be referred to as a first electrode) and an opposite electrode. The pixel electrode of the organic light-emitting diode OLED may be connected to the driving transistor T1 via the emission control transistor T6, and may be configured to receive a driving current, and the opposite electrode of the organic light-emitting diode OLED may be configured to receive the common voltage ELVSS. The organic light-emitting diode OLED may be configured to generate light of a luminance corresponding to the driving current.

Some of the plurality of thin-film transistors T1 to T7 may be n-channel metal-oxide field effect transistor (MOSFET) (NMOS) and the others may be p-channel MOSFET (PMOS). For example, from among the plurality of thin-film transistors T1 to T7, the compensation transistor T3 and the first initialization transistor T4 may be NMOSs, and the others from among the plurality of thin-film transistors T1, T2, and T5 to T7 may be PMOSs. Alternatively, from among the plurality of thin-film transistors T1 to T7, the compensation transistor T3, the first initialization transistor T4, and the second initialization transistor T7 may be NMOSs and the others of the transistors T1, T2, T5, and T6 may be PMOSs. Alternatively, all of the plurality of thin-film transistors T1 to T7 may be NMOSs or PMOSs. The plurality of thin-film transistors T1 to T7 may each include amorphous silicon or polysilicon. As may be suitable, a thin-film transistor that is an NMOS may include an oxide semiconductor. Hereinafter, a case in which the compensation transistor T3 and the first initialization transistor T4 are NMOSs including the oxide semiconductor and the others are PMOSs will be described for convenience of description.

The signal lines may include a first scan line SL1 configured to transmit a first scan signal Sn, a second scan line SL2 configured to transmit a second scan signal Sn', a previous scan line SLp configured to transmit a previous scan signal Sn-1 to the first initialization transistor T4, a next scan line SLn configured to transmit a next scan signal Sn+1 to the second initialization transistor T7, the emission control line EL configured to transmit an emission control signal En to the operation control transistor T5 and to the emission control transistor T6, and the data line DL crossing the first scan line SL1 and configured to transmit a data signal Dm. In this case, the data line DL may be one of the first-first data line DL1-1, the first-second data line DL1-2, the second-first data line DL2-1, the second-second data line DL2-2, and/or the third data line DL3, which have been described above with reference to FIG. 4.

The driving voltage line PL may be configured to transmit the driving voltage ELVDD to the driving transistor T1. The first initialization voltage line VL1 may be configured to transmit a first initialization voltage Vint1 for initializing the driving transistor T1. The second initialization voltage line VL2 may be configured to transmit a second initialization voltage Vint2 for initializing a first electrode of the organic light-emitting diode OLED.

A driving gate electrode of the driving transistor T1 may be connected to the storage capacitor Cst via a second node N2, one of a source region and/or a drain region of the driving transistor T1 may be connected to the driving voltage line PL through a first node N1 via the operation control transistor T5, and the other of the source region and the drain region of the driving transistor T1 may be electrically connected to the first electrode (pixel electrode) of the organic light-emitting diode OLED through a third node N3 via the emission control transistor T6. The driving transistor T1 may be configured to receive the data signal Dm according to a switching operation of the switching transistor T2, and may provide the driving current to the organic light-emitting diode OLED. That is, the driving transistor T1 may be configured to control an amount of current flowing from the first node N1 that is electrically connected to the driving voltage line PL to the organic light-emitting diode OLED, in response to a voltage applied to the second node N2, the voltage varying due to the data signal Dm.

A switching gate electrode of the switching transistor T2 may be connected to the first scan line SL1 configured to transmit the first scan signal Sn, one of a source region and/or a drain region of the switching transistor T2 may be connected to the data line DL, and the other of the source region and the drain region of the switching transistor T2 may be connected to the driving transistor T1 through the first node N1, and then may be connected to the driving voltage line PL through the operation control transistor T5. The switching transistor T2 may be configured to transmit the data signal Dm from the data line DL to the first node N1, in response to a voltage applied to the first scan line SL1. That is, the switching transistor T2 may be turned on in response to the first scan signal Sn transmitted through the first scan line SL1, and may be configured to perform a switching operation for transmitting the data signal Dm transmitted through the data line DL, to the driving transistor T1 through the first node N1.

A compensation gate electrode of the compensation transistor T3 is connected to the second scan line SL2. One of a source region and a drain region of the compensation transistor T3 may be connected to the first electrode of the organic light-emitting diode OLED through the third node N3 via the emission control transistor T6. The other of the source region and the drain region of the compensation transistor T3 may be connected to a first capacitor electrode CE1 of the storage capacitor Cst and to the driving gate electrode of the driving transistor T1 through the second node N2. The compensation transistor T3 may be turned on in response to the second scan signal Sn' transmitted through the second scan line SL2 to diode-connect the driving transistor T1.

A first initialization gate electrode of the first initialization transistor T4 may be connected to the previous scan line SLp. One of a source region and a drain region of the first initialization transistor T4 may be connected to the first initialization voltage line VL1. The other of the source region and the drain region of the first initialization transistor T4 may be connected to the first capacitor electrode CE1 of the storage capacitor Cst and to the driving gate electrode of the driving transistor T1 through the second node N2. The first initialization transistor T4 may be configured to apply the first initialization voltage Vint1 from the first initialization voltage line VL1 to the second node N2, in response to a voltage applied to the previous scan line SLp. That is, the first initialization transistor T4 may be turned on in response to the previous scan signal Sn-1 transmitted through the previous scan line SLp, and may be configured to transmit the first initialization voltage Vint1 to the driving gate electrode of the driving transistor T1, and to perform an initialization operation for initializing a voltage at the driving gate electrode of the driving transistor T1.

An operation control gate electrode of the operation control transistor T5 may be connected to the emission control line EL, one of a source region and/or a drain region of the operation control transistor T5 may be connected to the driving voltage line PL, and the other thereof may be connected to the driving transistor T1 and the switching transistor T2 through the first node N1.

An emission control gate electrode of the emission control transistor T6 may be connected to the emission control line EL, one of a source region and/or a drain region of the emission control transistor T6 may be connected to the driving transistor T1 and to the compensation transistor T3 through the third node N3, and the other of the source region and the drain region of the emission control transistor T6 may be electrically connected to the first electrode (pixel electrode) of the organic light-emitting diode OLED.

The operation control transistor T5 and the emission control transistor T6 are concurrently or substantially simultaneously turned on in response to the emission control signal En transmitted through the emission control line EL, and may be configured to transmit the driving voltage ELVDD to the organic light-emitting diode OLED, and to allow the driving current to flow in the organic light-emitting diode OLED.

A second initialization gate electrode of the second initialization transistor T7 may be connected to the next scan line SLn, one of a source region and/or a drain region of the second initialization transistor T7 may be connected to the first electrode (pixel electrode) of the organic light-emitting diode OLED, and the other of the source region and the drain region of the second initialization transistor T7 may be connected to the second initialization voltage line VL2, and may be configured to receive the second initialization voltage Vint2. The second initialization transistor T7 is turned on in response to the next scan signal Sn+1 transmitted through the next scan line SLn, and may be configured to initialize the first electrode (pixel electrode) of the organic light-emitting diode OLED. The next scan line SLn and the first scan line SL1 may be the same as each other. In this case, the corresponding scan line may be configured to transmit the same electrical signal with a time difference, and may function as the first scan line SL1 or the next scan line SLn. That is, the next scan line SLn may be a first scan line of a pixel electrically connected to the data line DL as a pixel adjacent to the pixel P of FIG. 5.

The second initialization transistor T7 may be connected to the first scan line SL1 as shown in FIG. 5. However, one or more embodiments are not limited thereto. The second initialization transistor T7 may also be connected to the emission control line EL, and may be driven according to the emission control signal En.

The storage capacitor Cst may include the first capacitor electrode CE1 and a second capacitor electrode CE2. The first capacitor electrode CE1 of the storage capacitor Cst is connected to the driving gate electrode of the driving transistor T1 through the second node N2, and the second capacitor electrode CE2 of the storage capacitor Cst is connected to the driving voltage line PL. The storage capacitor Cst may store an electric charge corresponding to a difference between a voltage at the driving gate electrode of the driving transistor T1 and the driving voltage ELVDD.

A detailed operation of each pixel P is as follows.

During an initialization period, if the previous scan signal Sn-1 is supplied through the previous scan line SLp, the first initialization transistor T4 is turned on in response to the previous scan signal Sn-1, and the driving transistor T1 is initialized by the first initialization voltage Vint1 supplied from the first initialization voltage line VL1.

During a data programming period, if the first scan signal Sn and the second scan signal Sn' are supplied through the first scan line SL1 and the second scan line SL2, then the switching transistor T2 and the compensation transistor T3 are turned on in response to the first scan signal Sn and the second scan signal Sn'. In this case, the driving transistor T1 is diode-connected by the compensation transistor T3 that is turned on, and is biased in a forward direction. Then, a compensation voltage Dm+Vth (Vth has a negative value) that is obtained by subtracting a threshold voltage Vth of the driving transistor T1 from the data signal Dm supplied from the data line DL is applied to the driving gate electrode of the driving transistor T1. The driving voltage ELVDD and the compensation voltage Dm+Vth are applied to both ends of the storage capacitor Cst, and the storage capacitor Cst stores a charge corresponding to a difference between voltages at both ends.

During an emission period, the operation control transistor T5 and the emission control transistor T6 are turned on in response to the emission control signal En supplied from the emission control line EL. The driving current is generated according to a difference between the voltage at the driving gate electrode of the driving transistor T1 and the driving voltage ELVDD, and the driving current is supplied to the organic light-emitting diode OLED through the emission control transistor T6.

As described above, some of the plurality of thin-film transistors T1 to T7 may include an oxide semiconductor. For example, the compensation transistor T3 and the first initialization transistor T4 may include an oxide semiconductor.

Because polysilicon has high reliability, the compensation transistor T3 and the first initialization transistor T4 may control an accurately intended current to flow. Therefore, the driving transistor T1 that directly affects the brightness of the display apparatus 1 includes a semiconductor layer including polysilicon having high reliability, and thus, a high-resolution display apparatus may be implemented. In addition, the oxide semiconductor has a relatively high carrier mobility and a relatively low leakage current, a voltage drop may not be large even if a driving time is relatively long. That is, because there is a relatively small color change in an image due to the voltage drop even in low-frequency driving, the oxide semiconductor may be driven at a relatively low frequency. Therefore, the compensation transistor T3 and the first initialization transistor T4 include the oxide semiconductor, and thus, a display apparatus in which a leakage current is reduced or prevented from occurring and in which power consumption is reduced may be implemented.

In addition, because the oxide semiconductor is sensitive to light, there may be a variation in a current amount due to external light. Therefore, a metal layer may be located under the oxide semiconductor to absorb or reflect the external light. Accordingly, as shown in FIG. 5, a gate electrode of each of the compensation transistor T3 and the first initialization transistor T4 including the oxide semiconductor may be located over and under an oxide semiconductor layer. That is, when viewed from a direction perpendicular to the upper surface of the substrate 100 (e.g. refer to FIG. 3) (z-axis direction), a metal layer under the oxide semiconductor may overlap the oxide semiconductor.

Figure 6:
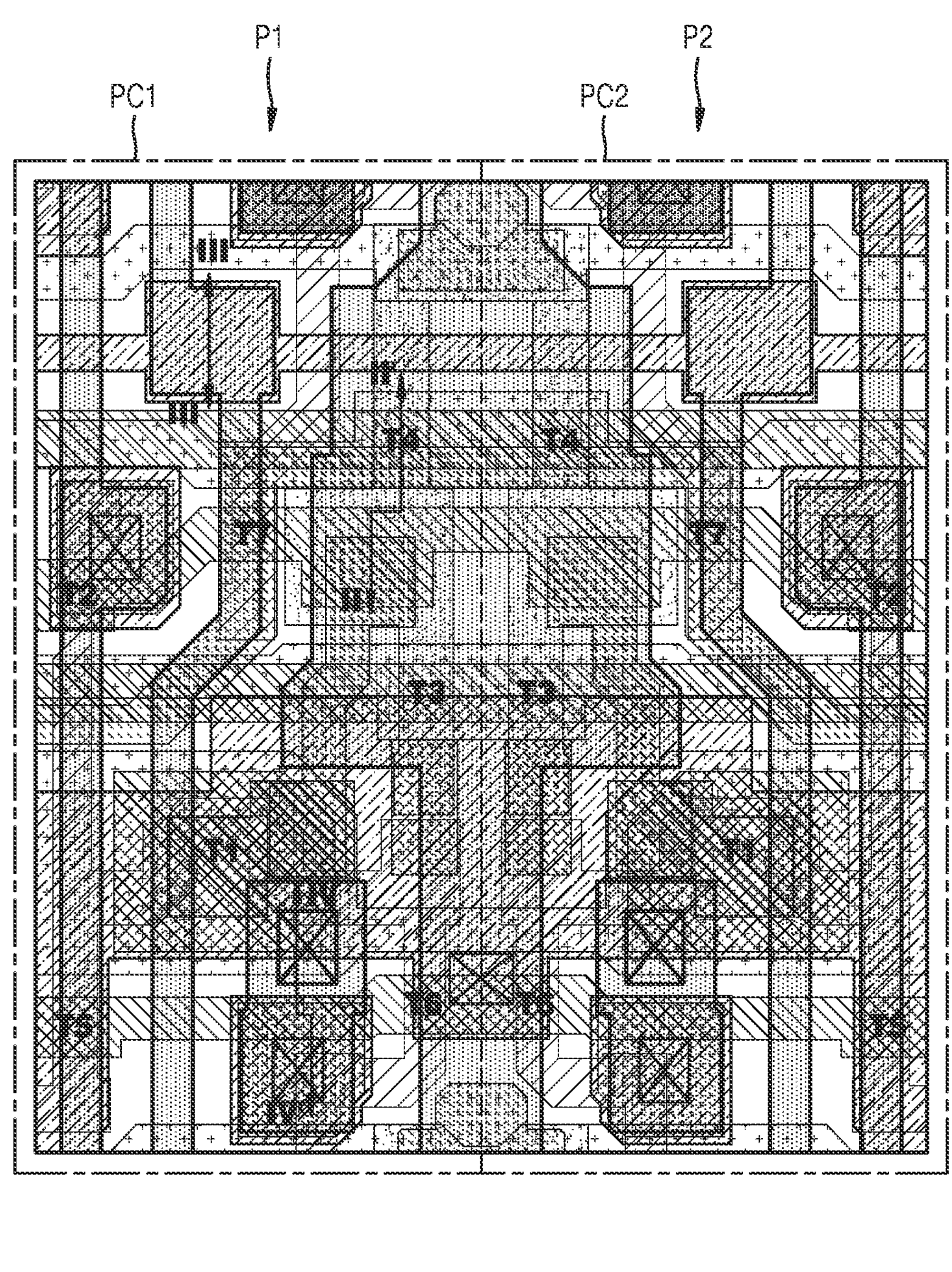
FIG. 6 is a schematic layout view of positions of transistors and capacitors in pixels included in the display apparatus of FIG. 1.
Figure 13:
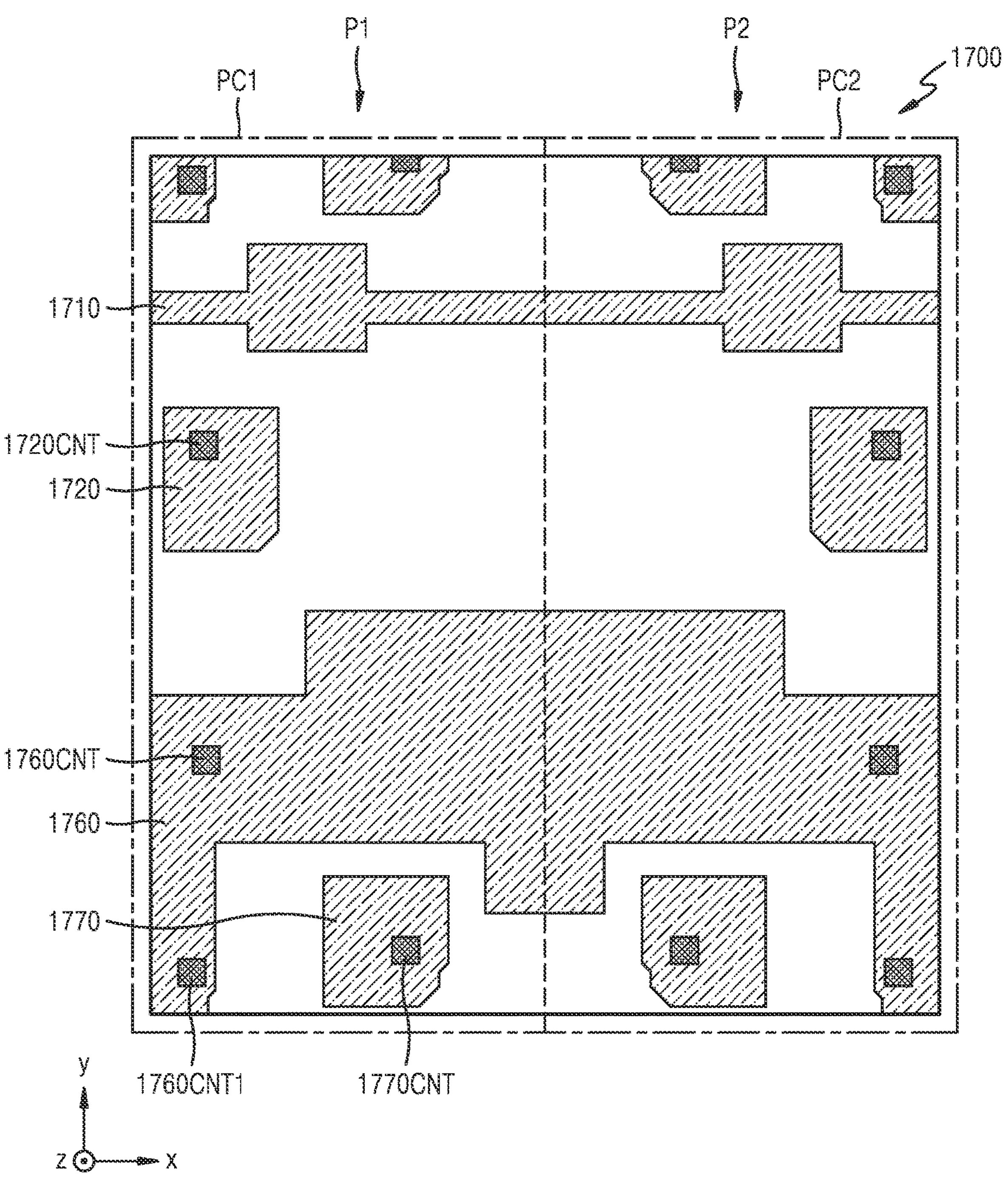
Figure 14:
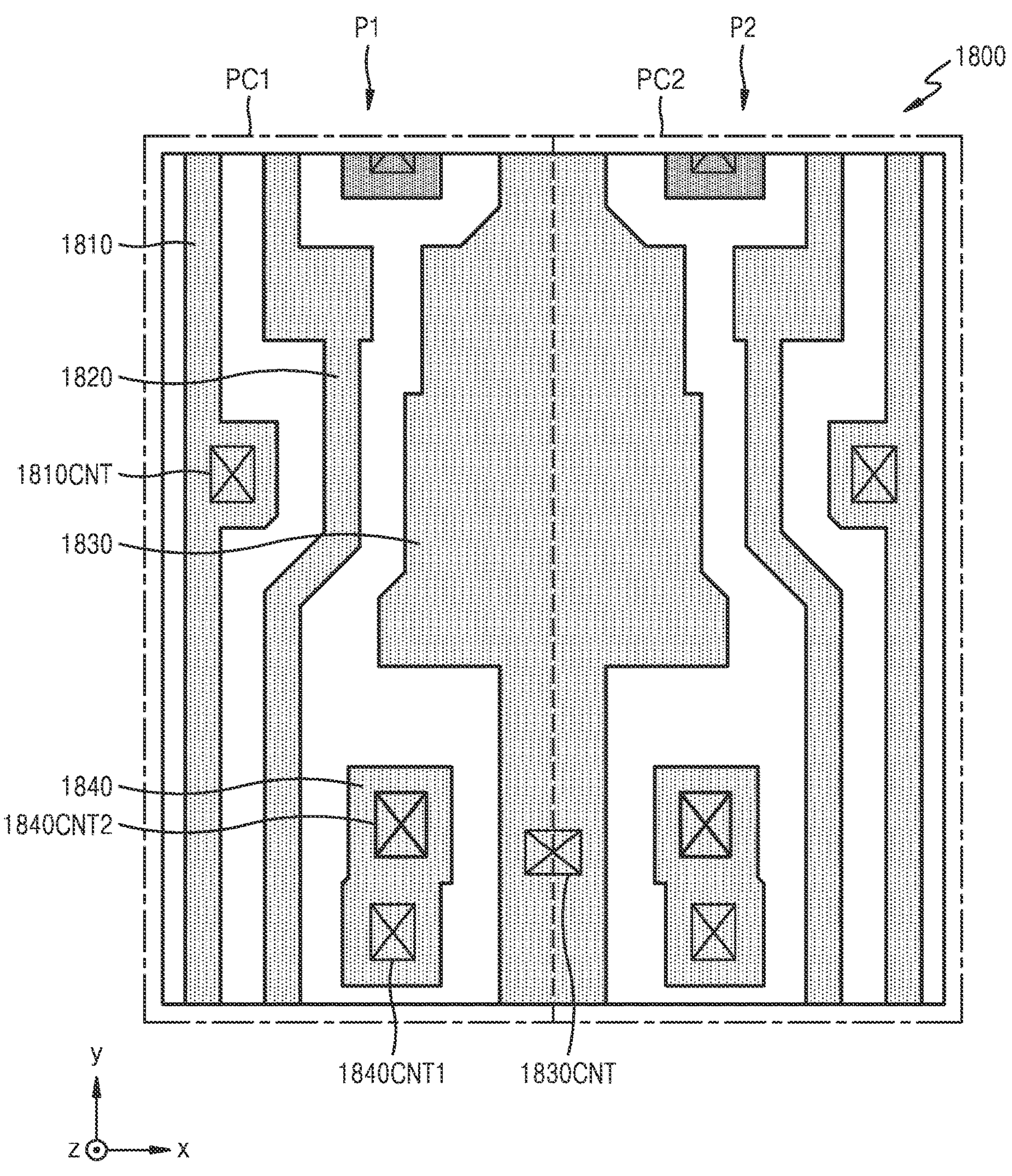
Figure 15:
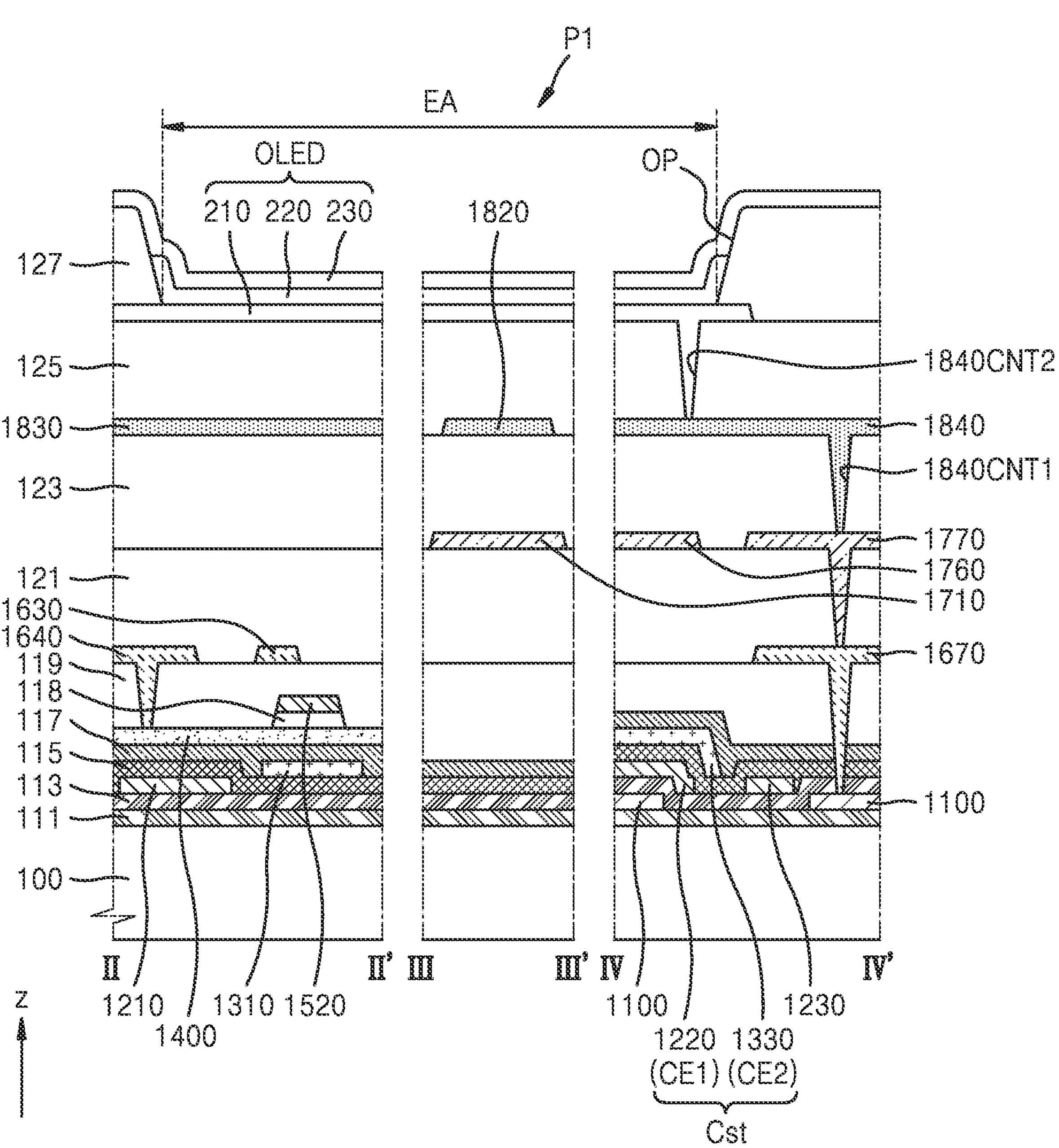
FIG. 15 is a schematic cross-sectional view of the display apparatus of FIG. 6, taken along the lines II-II', III-III', and IV-IV'.

FIG. 6 is a schematic layout view of positions of transistors and capacitors in pixels included in the display apparatus 1 of FIG. 1, FIGS. 7 to 14 are schematic layout views of elements, such as transistors and capacitors for each layer in the display apparatus 1 of FIG. 6, and FIG. 15 is a schematic cross-sectional view of the display apparatus 1 of FIG. 6, taken along the lines II-II', III-III', and IV-IV'.

As shown in the drawings, the display apparatus 1 may include a first pixel P1 and a second pixel P2 adjacent to each other. As shown in FIG. 6, etc., the first pixel P1 may be symmetrical to the second pixel P2 with respect to a virtual line. Otherwise, the first pixel P1 and the second pixel P2 may have the same structure, not the symmetrical structure. The first pixel P1 may include a first pixel circuit PC1, and the second pixel P2 may include a second pixel circuit PC2. Hereinafter, some conductive patterns will be described based on the first pixel circuit PC1 for convenience of description, but the conductive patterns may be symmetrically arranged in the second pixel circuit PC2.

A buffer layer 111 (see FIG. 15) including silicon oxide, silicon nitride, or silicon oxynitride may be located on the substrate 100 (see FIG. 15). The buffer layer 111 may reduce or prevent metal atoms or impurities dispersing from the substrate 100 to a first semiconductor layer 1100 thereover. Also, the buffer layer 111 may adjust a speed of providing heat during a crystallization process for forming the first semiconductor layer 1100, such that the first semiconductor layer 1100 may be evenly crystallized.

Figure 7:
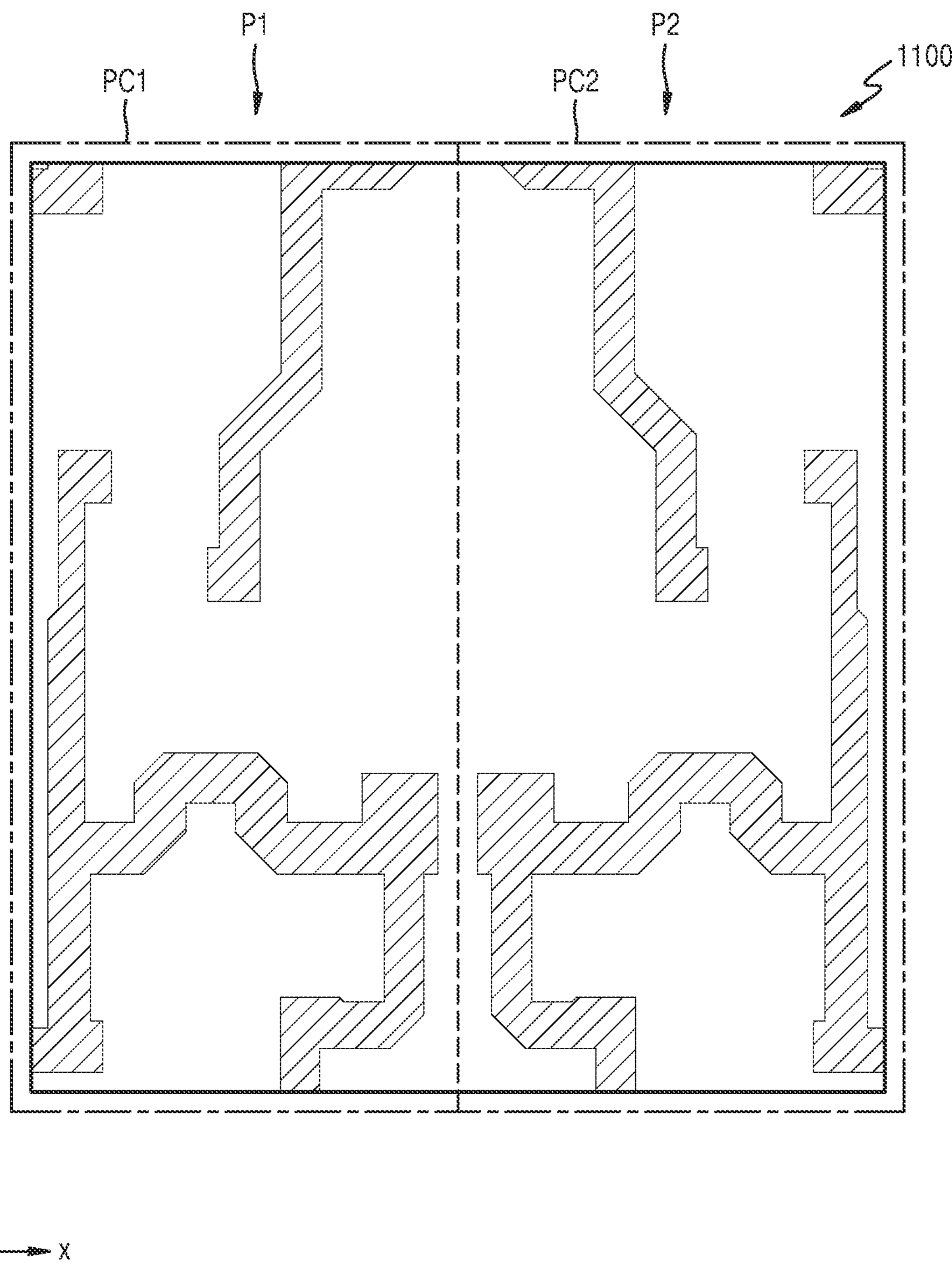
FIGS. 7 to 14 are schematic layout views of elements, such as transistors and capacitors for each layer in the display apparatus of FIG. 6.

The first semiconductor layer 1100, as shown in FIG. 7, may be located on the buffer layer 111. The first semiconductor layer 1100 may include a silicon semiconductor. For example, the first semiconductor layer 1100 may include amorphous silicon or polysilicon. In detail, the first semiconductor layer 1100 may include polysilicon that is crystallized at a low temperature. As may be suitable, ions may be implanted into at least a portion of the first semiconductor layer 1100.

As described above, the driving transistor T1, the switching transistor T2, the operation control transistor T5, the emission control transistor T6, and the second initialization transistor T7 may be PMOSs, and in this case, such thin-film transistors may be arranged according to the first semiconductor layer 1100 shown in FIG. 7.

A first gate-insulating layer 113 (see FIG. 15) may cover the first semiconductor layer 1100 and may be arranged over the substrate 100. The first gate-insulating layer 113 may include an insulating material. For example, the first gate-insulating layer 113 may include silicon oxide, silicon nitride, silicon oxynitride, or aluminum oxide.

Figure 8:
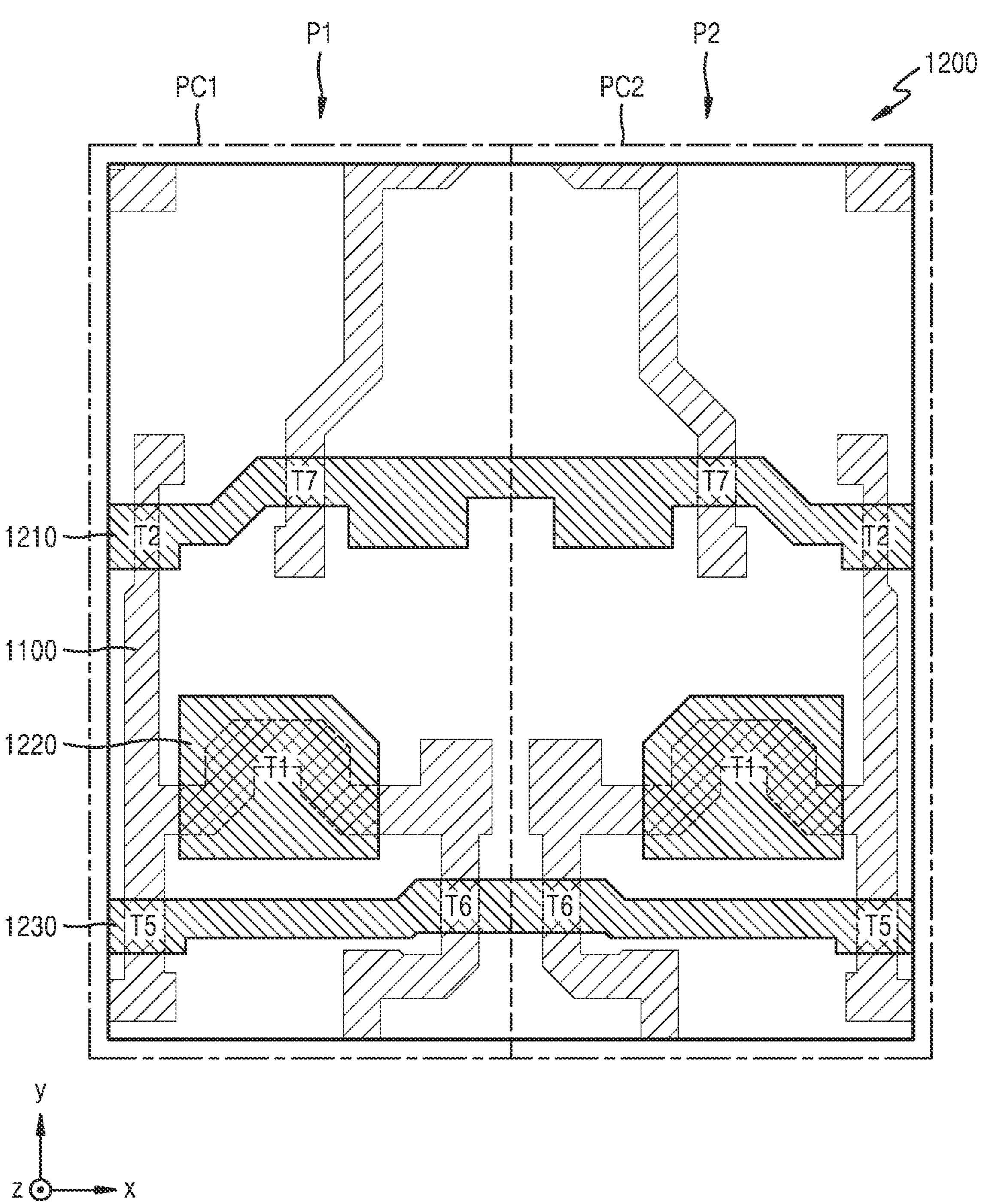

A first gate layer 1200 as shown in FIG. 8 may be located on the first gate-insulating layer 113. For convenience, FIG. 8 illustrates the first gate layer 1200 and the first semiconductor layer 1100 together. The first gate layer 1200 may include a first gate line 1210, a first gate electrode 1220, and a second gate line 1230.

The first gate line 1210 may extend in a first direction (x-axis direction). The first gate line 1210 may be the first scan line SL1 or the next scan line SLn of FIG. 5. That is, in the first pixel P1, as shown in FIG. 8, the first gate line 1210 may correspond to the first scan line SL1 of FIG. 5, and in a pixel adjacent to the first pixel P1 in the +y direction, the first gate line 1210 may correspond to the next scan line SLn of FIG. 5. Accordingly, the first scan signal Sn (e.g. refer to FIG. 5) and the next scan signal Sn+1 (e.g. refer to FIG. 5) may be applied to the pixels through the first gate line 1210. Portions of the first gate line 1210, which overlap the first semiconductor layer 1100, may be the switching gate electrode of the switching transistor T2 and the second initialization gate electrode of the second initialization transistor T7.

The first gate electrode 1220 may have an isolated shape. The first gate electrode 1220 is the driving gate electrode of the driving transistor T1. For reference, a portion of the first semiconductor layer 1100, which overlaps the first gate electrode 1220, and a peripheral portion thereof may be referred to as a driving semiconductor layer.

The second gate line 1230 may extend in the first direction (x-axis direction). The second gate line 1230 may correspond to the emission control line EL of FIG. 5. Portions of the second gate line 1230, which overlap the first semiconductor layer 1100, may be the operation control gate electrode of the operation control transistor T5 and the emission control gate electrode of the emission control transistor T6. The emission control signal En (e.g. refer to FIG. 5) may be applied to the pixels through the second gate line 1230.

The first gate layer 1200 may include a metal, an alloy, a conductive metal oxide, or a transparent conductive material. For example, the first gate layer 1200 may include silver (Ag), an alloy including Ag, molybdenum (Mo), an alloy including Mo, aluminum (Al), an alloy including Al such as aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide (ITO), or indium zinc oxide (IZO). The first gate layer 1200 may have a multi-layered structure, for example, the first gate layer 1200 may have a dual-layered structure including Mo/Al or a triple-layered structure including Mo/Al/Mo.

A second gate-insulating layer 115 (see FIG. 15) may cover the first gate layer 1200, and may be located on the first gate-insulating layer 113. The second gate-insulating layer 115 may include an insulating material that is the same as, or similar to, that of the first gate-insulating layer 113.

Figure 9:
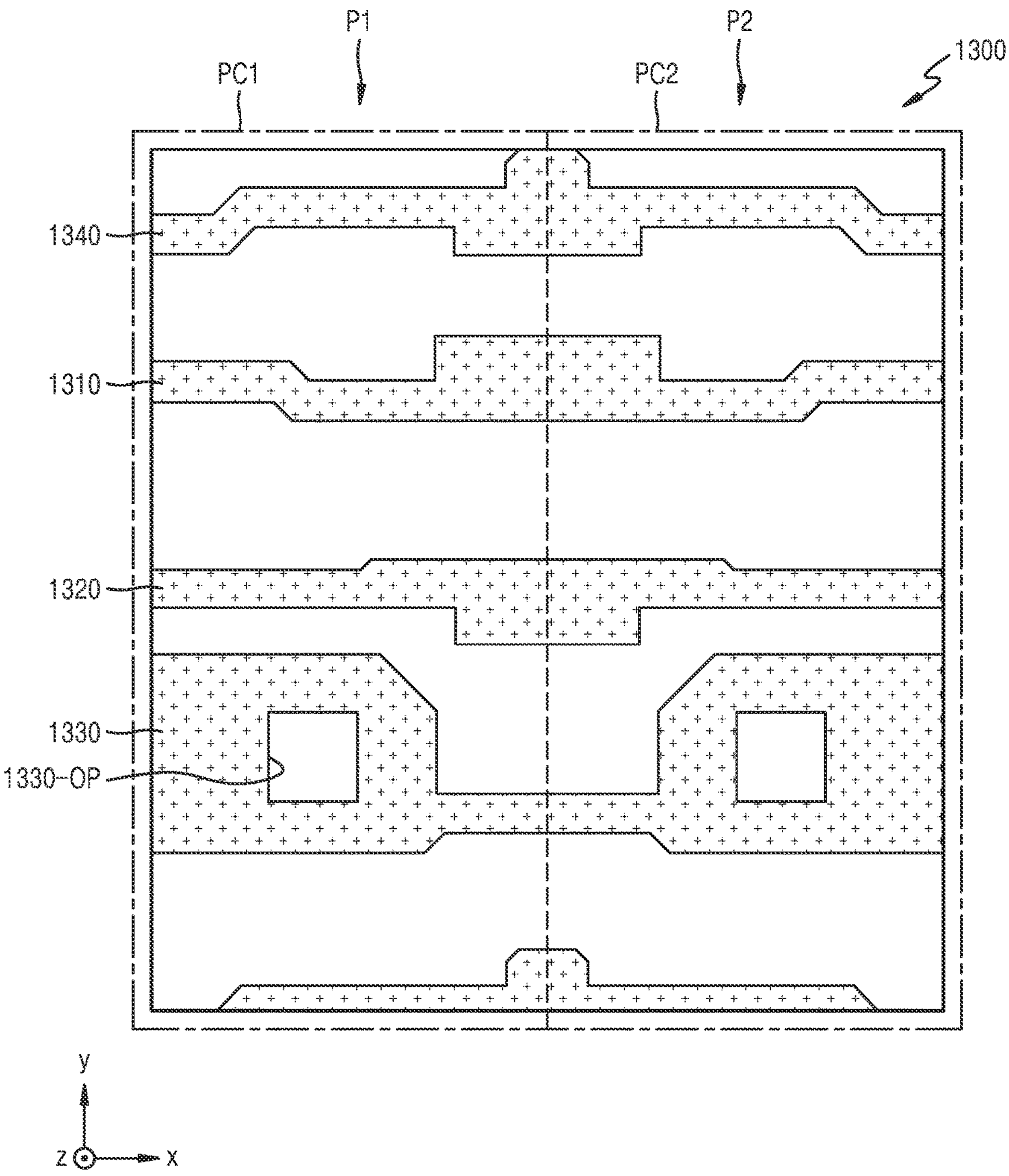

A second gate layer 1300 may be located on the second gate-insulating layer 115. As shown in FIG. 9, The second gate layer 1300 may include a third gate line 1310, a fourth gate line 1320, a capacitor upper electrode 1330, and a first initialization voltage line 1340 (that is, the first initialization voltage line VL1 of FIG. 5).

The third gate line 1310 may extend in the first direction (x-axis direction). The third gate line 1310 may correspond to the previous scan line SLp of FIG. 5. When viewed from a direction (z-axis direction) perpendicular to the substrate 100, the third gate line 1310 may be spaced apart from the first gate line 1210. The previous scan signal Sn-1 (e.g. refer to FIG. 5) may be applied to the pixels through the third gate line 1310. A portion of the third gate line 1310, which overlaps a second semiconductor layer 1400 described below, may be a first initialization lower gate electrode of the first initialization transistor T4.

The fourth gate line 1320 may also extend in the first direction (x-axis direction). The fourth gate line 1320 may correspond to the second scan line SL2 of FIG. 5. When viewed in the direction (z-axis direction) perpendicular to the substrate 100, the fourth gate line 1320 may be spaced apart from the first gate line 1210 and the third gate line 1310 (e.g., may be spaced apart in plan view). The second scan signal Sn' (e.g. refer to FIG. 5) may be applied to the pixels through the fourth gate line 1320. A portion of the fourth gate line 1320, which overlaps the second semiconductor layer 1400 described below, may be a compensation lower gate electrode of the compensation transistor T3.

The third gate line 1310 and the fourth gate line 1320 are located under the second semiconductor layer 1400 that will be described below with reference to FIG. 10, and may function as lower protective metals for protecting the portions of the second semiconductor layer 1400, which overlap the third gate line 1310 and the fourth gate line 1320, as well as gate electrodes.

The capacitor upper electrode 1330 may overlap the first gate electrode 1220, and may extend in the first direction (x-axis direction). The capacitor upper electrode 1330 may correspond to the second capacitor electrode CE2 of FIG. 5, and may form the storage capacitor Cst (e.g. refer to FIG. 5) together with the first gate electrode 1220. The driving voltage ELVDD may be applied to the capacitor upper electrode 1330. Also, the capacitor upper electrode 1330 may include a hole (e.g. an opening 1330-OP) passing through the capacitor upper electrode 1330, and at least a portion of the first gate electrode 1220 may overlap the hole.

The first initialization voltage line 1340 corresponding to the first initialization voltage line VL1 of FIG. 5 may extend in the first direction (x-axis direction). When viewed from the direction (z-axis direction) perpendicular to the substrate 100, the first initialization voltage line 1340 may be spaced apart from the third gate line 1310. The first initialization voltage Vint1 may be applied to the pixels through the first initialization voltage line 1340. The first initialization voltage line 1340 may overlap at least a portion of the second semiconductor layer 1400, and may be configured to apply the first initialization voltage Vint1 to the second semiconductor layer 1400. The first initialization voltage line 1340 may be electrically connected to the second semiconductor layer 1400 through contact holes 1680CNT1, 1680CNT2, and 1680CNT3 described below with reference to FIG. 12.

The second gate layer 1300 may include a metal, an alloy, a conductive metal oxide, or a transparent conductive material. For example, the second gate layer 1300 may include Ag, an alloy including Ag, Mo, an alloy including Mo, Al, an alloy including Al such as AlN, W, WN, Cu, Ni, Cr, CrN, Ti, Ta, Pt, Sc, ITO, or IZO. The second gate layer 1300 may have a multi-layered structure, for example, the second gate layer 1300 may have a dual-layered structure including Mo/Al or a triple-layered structure including Mo/Al/Mo.

A first interlayer insulating layer 117 (see FIG. 15) may cover the second gate layer 1300, and may be located on the second gate-insulating layer 115. The first interlayer insulating layer 117 may include an insulating material. For example, the first interlayer insulating layer 117 may include silicon oxide, silicon nitride, silicon oxynitride, or aluminum oxide.

Figure 10:
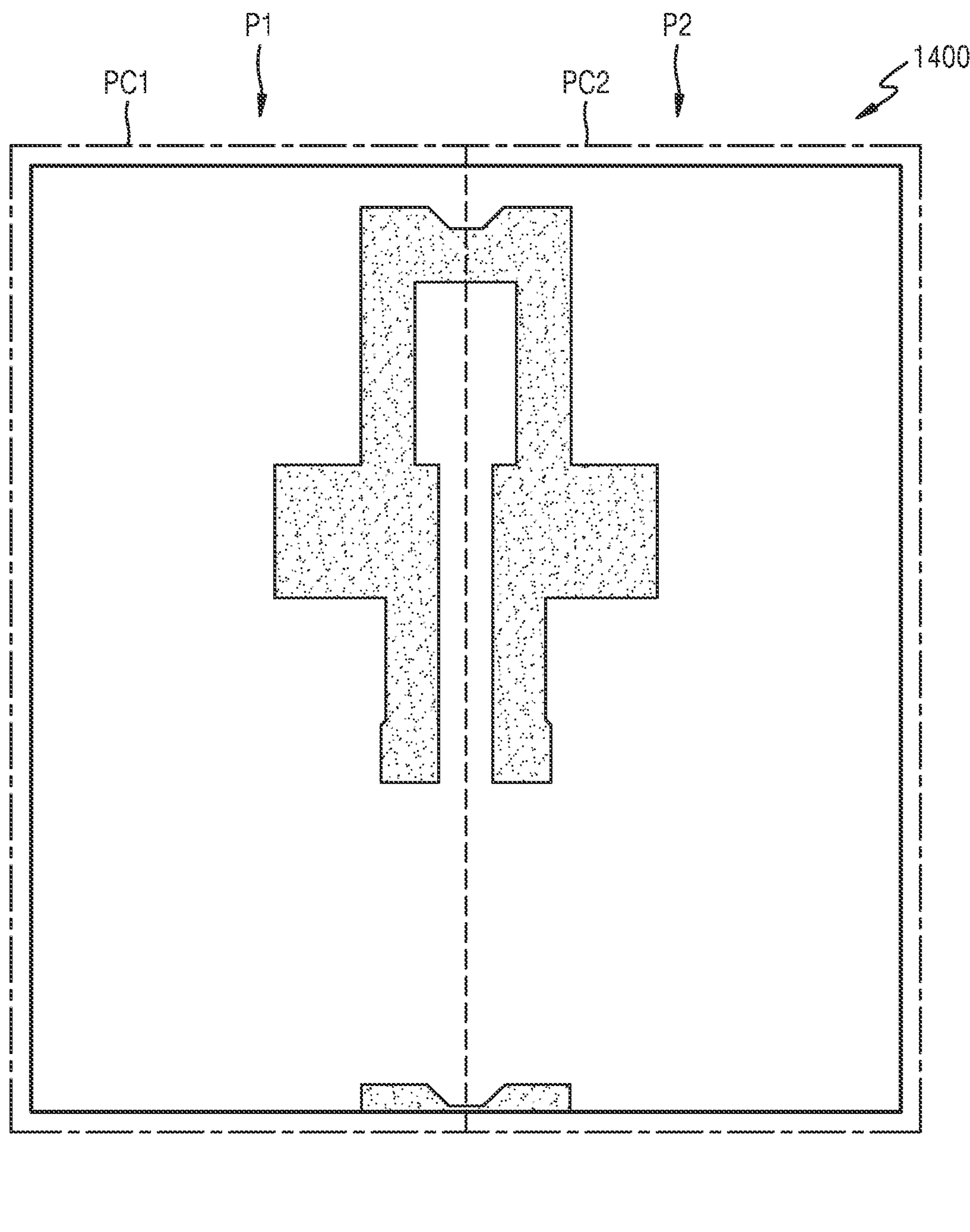

The second semiconductor layer 1400 as shown in FIG. 10 may be located on the first interlayer insulating layer 117. As described above, the second semiconductor layer 1400 may include an oxide semiconductor. The second semiconductor layer 1400 may be located on a different layer from a layer on which the first semiconductor layer 1100 is located, and when viewed from the direction (z-axis direction) perpendicular to the substrate 100, the second semiconductor layer 1400 may not overlap the first semiconductor layer 1100.

A third gate-insulating layer 118 (see FIG. 15) may cover the second semiconductor layer 1400, and may be located on the first interlayer insulating layer 117. The third gate-insulating layer 118 may include an insulating material. As shown in FIG. 15, the third gate-insulating layer 118 may be located only over a portion of the second semiconductor layer 1400, and may not be located on (e.g., may not contact) the first interlayer insulating layer 117. In the latter case, as shown in FIG. 15, the third gate-insulating layer 118 may have the same pattern as that of the third gate layer 1500 that will be described below with reference to FIG. 11. That is, when viewed from the direction (z-axis direction) perpendicular to the substrate 100, the third gate-insulating layer 118 may completely or nearly completely overlap the third gate layer 1500. This is because the third gate-insulating layer 118 and the third gate layer 1500 are concurrently or substantially simultaneously patterned. Accordingly, in the second semiconductor layer 1400, source and drain regions may not be covered by the third gate-insulating layer 118, except for channel regions overlapping the third gate layer 1500. The source and drain regions may be in direct contact with a second interlayer insulating layer 119 as shown in FIG. 15. The third gate-insulating layer 118 may include silicon oxide, silicon nitride, silicon oxynitride, or aluminum oxide.

Figure 11:
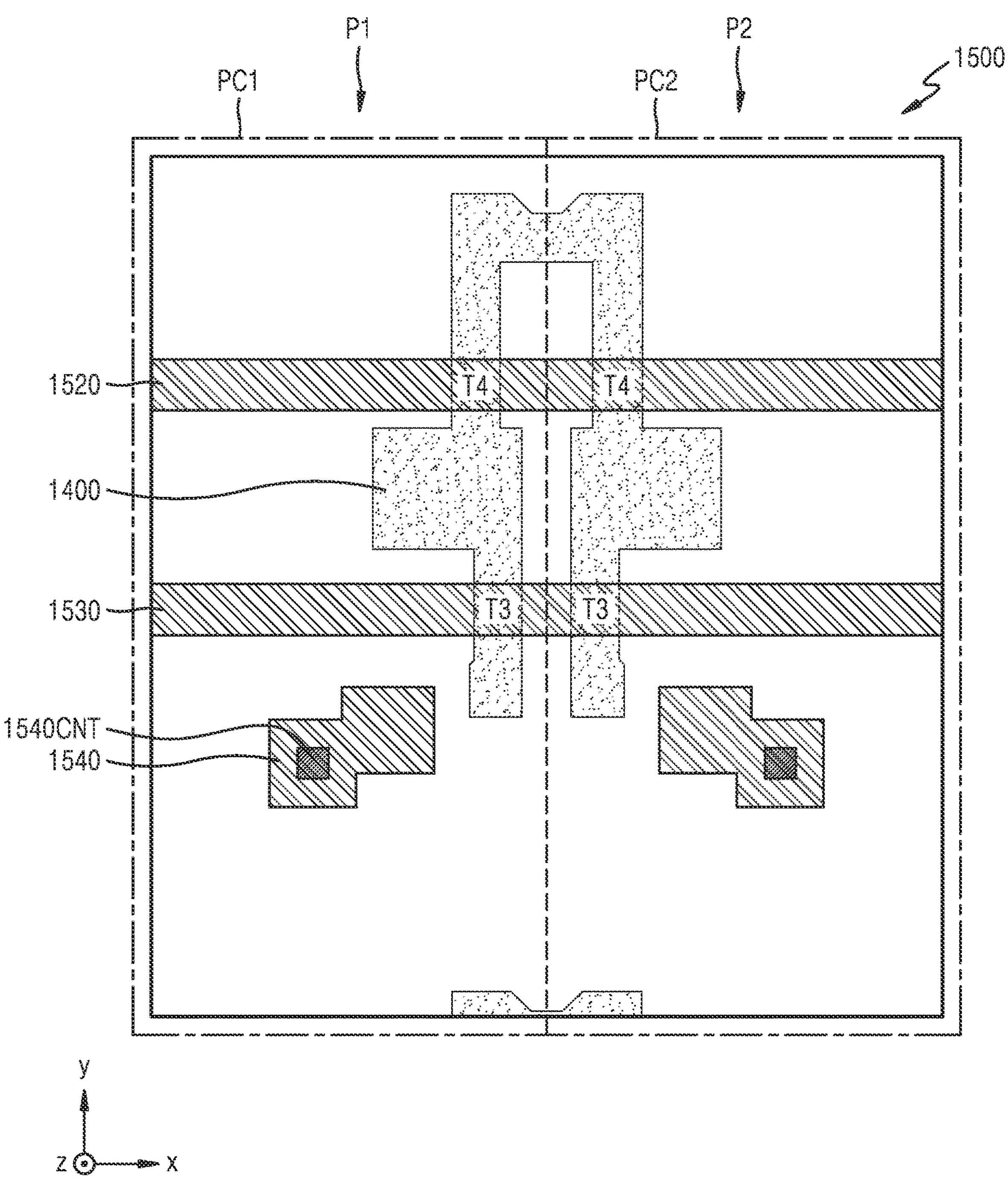

The third gate layer 1500 as shown in FIG. 11 may be located on the third gate-insulating layer 118. The third gate layer 1500 may include a fifth gate line 1520, a sixth gate line 1530, and a first transmission line 1540.

The fifth gate line 1520 may extend in the first direction (x-axis direction). When viewed from the direction (z-axis direction) perpendicular to the substrate 100, the fifth gate line 1520 may overlap the third gate line 1310. A portion of the fifth gate line 1520, which overlaps the second semiconductor layer 1400, may be a first initialization upper gate electrode of the first initialization transistor T4. A portion of the second semiconductor layer 1400, which overlaps the fifth gate line 1520, and a peripheral portion thereof may be referred to as a first initialization semiconductor layer. The fifth gate line 1520 may be electrically connected to the third gate line 1310. For example, the fifth gate line 1520 may be electrically connected to the third gate line 1310 through a contact hole formed in an insulating layer between the fifth gate line 1520 and the third gate line 1310. Such the contact hole may be positioned in the display area DA (e.g. refer to FIG. 1) or in the peripheral area PA (e.g. refer to FIG. 1). Accordingly, the fifth gate line 1520 may correspond to the previous scan line SLp of FIG. 5 together with the third gate line 1310. Accordingly, the previous scan signal Sn-1 may be applied to the pixels through the fifth gate line 1520 and/or the third gate line 1310.

The sixth gate line 1530 may extend in the first direction (x-axis direction). When viewed from the direction (z-axis direction) perpendicular to the substrate 100, the sixth gate line 1530 may overlap the fourth gate line 1320. A portion of the sixth gate line 1530, which overlaps the second semiconductor layer 1400, may be a compensation upper gate electrode of the compensation transistor T3. The sixth gate line 1530 may be electrically connected to the fourth gate line 1320. For example, the sixth gate line 1530 may be electrically connected to the fourth gate line 1320 through a contact hole formed in an insulating layer between the sixth gate line 1530 and the fourth gate line 1320. Such contact hole may be positioned in the display area DA or in the peripheral area PA. Accordingly, the sixth gate line 1530 may correspond to the second scan line SL2 of FIG. 5 together with the fourth gate line 1320. Accordingly, the second scan signal Sn' may be applied to the pixels through the sixth gate line 1530 and/or the fourth gate line 1320.

The first transmission line 1540 may be electrically connected to the first gate electrode 1220, for example, the driving gate electrode, through a contact hole 1540CNT that passes through an opening 1330-OP of the capacitor upper electrode 1330. The first transmission line 1540 may be configured to transmit, to the first gate electrode 1220, the first initialization voltage Vint1 transmitted through the first initialization transistor T4.

The third gate layer 1500 may include a metal, an alloy, a conductive metal oxide, or a transparent conductive material. For example, the third gate layer 1500 may include Ag, an alloy including Ag, Mo, an alloy including Mo, Al, an alloy including Al such as AlN, W, WN, Cu, Ni, Cr, CrN, Ti, Ta, Pt, Sc, ITO, or IZO. The third gate layer 1500 may have a multi-layered structure, for example, the third gate layer 1500 may have a dual-layered structure including Mo/Al or a triple-layered structure including Mo/Al/Mo.

The second interlayer insulating layer 119 (see FIG. 15) may at least partially cover the third gate layer 1500 of FIG. 11. The second interlayer insulating layer 119 may include an insulating material. For example, the second interlayer insulating layer 119 may include silicon oxide, silicon nitride, silicon oxynitride, or aluminum oxide.

Figure 12:
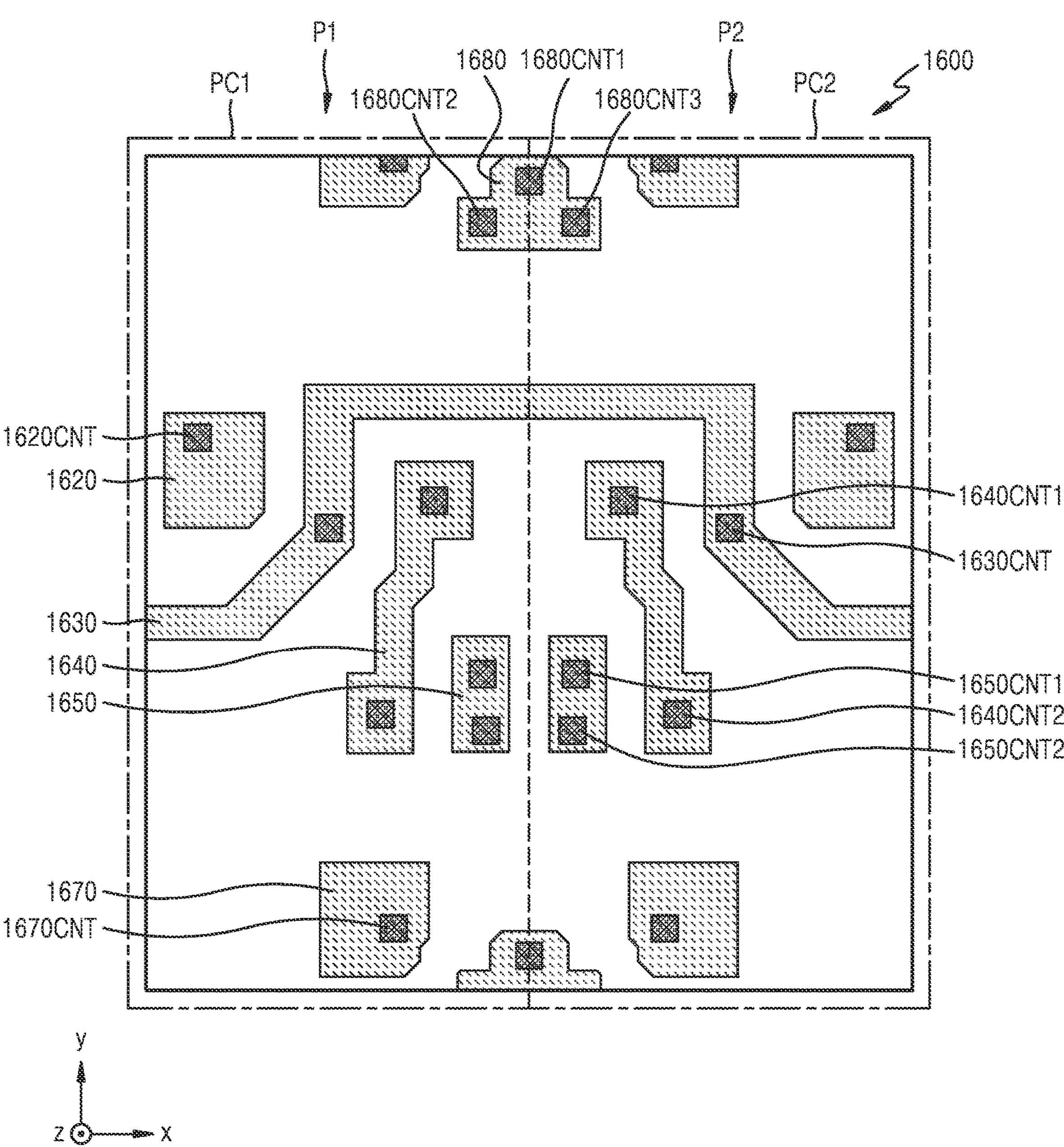

A first connection electrode layer 1600, as shown in FIG. 12, may be located on the second interlayer insulating layer 119. The first connection electrode layer 1600 may include a second transmission line 1620, a second initialization voltage line 1630, a third transmission line 1640, a fourth transmission line 1650, a fifth transmission line 1670, and a sixth transmission line 1680.

The second transmission line 1620 may be electrically connected to the first semiconductor layer 1100 through a contact hole 1620CNT. A data signal Dm (e.g. refer to FIG. 5) from a data line 1810 that will be described below with reference to FIG. 14 may be transmitted to the first semiconductor layer 1100 through the second transmission line 1620 and applied to the switching transistor T2.

The second initialization voltage line 1630 may extend in the first direction (x-axis direction). The second initialization voltage line 1630 corresponding to the second initialization voltage line VL2 of FIG. 5 may be configured to apply the second initialization voltage Vint2 (e.g. refer to FIG. 5) to the pixels. The second initialization voltage line 1630 may be electrically connected to the first semiconductor layer 1100 through a contact hole 1630CNT, and the second initialization voltage Vint2 may be transmitted to the first semiconductor layer 1100 and applied to the second initialization transistor T7.

The third transmission line 1640 may electrically connect the second semiconductor layer 1400 to the first transmission line 1540 through contact holes 1640CNT1 and 1640CNT2 formed in one side and the other side thereof. The first transmission line 1540 is electrically connected to the first gate electrode 1220, for example, the driving gate electrode, and thus, the third transmission line 1640 may electrically connect the first initialization semiconductor layer, which is a portion of the second semiconductor layer 1400, to the driving gate electrode. The first initialization voltage Vint1 may be transmitted to the first gate electrode 1220, for example, the driving gate electrode, through the second semiconductor layer 1400, the third transmission line 1640, and the first transmission line 1540.

The fourth transmission line 1650 may electrically connect the second semiconductor layer 1400 to the first semiconductor layer 1100 through contact holes 1650CNT1 and 1650CNT2 formed in one side and the other side thereof. That is, the fourth transmission line 1650 may electrically connect the compensation transistor T3 to the driving transistor T1.

The fifth transmission line 1670 may be electrically connected to the first semiconductor layer 1100 through a contact hole 1670CNT. The fifth transmission line 1670 may be configured to transmit, to the organic light-emitting diode OLED, the driving current or the second initialization voltage Vint2 from the first semiconductor layer 1100.

The sixth transmission line 1680 may be electrically connected to the second semiconductor layer 1400 through contact holes 1680CNT2 and 1680CNT3. In addition, the sixth transmission line 1680 may be electrically connected to the first initialization voltage line 1340 of FIG. 9 through a contact hole 1680CNT1. Accordingly, the sixth transmission line 1680 may be configured to transmit, to the first initialization transistor T4, the first initialization voltage Vint1 from the first initialization voltage line 1340.

The first connection electrode layer 1600 may include a metal, an alloy, a conductive metal oxide, or a transparent conductive material. For example, the first connection electrode layer 1600 may include Ag, an alloy including Ag, Mo, an alloy including Mo, Al, an alloy including Al such as AlN, W, WN, Cu, Ni, Cr, CrN, Ti, Ta, Pt, Sc, ITO, or IZO. The first connection electrode layer 1600 may have a multi-layered structure, for example, the first connection electrode layer 1600 may have a dual-layered structure including Ti/Al or a triple-layered structure including Ti/Al/Ti.

A first planarized insulating layer 121 may cover the first connection electrode layer 1600, and may be located on the second interlayer insulating layer 119. The first planarized insulating layer 121 may include an organic insulating material. For example, the first planarized insulating layer 121 may include photoresist, benzocyclobutene (BCB), polyimide, hexamethyldisiloxane (HMDSO), polymethylmethacrylate (PMMA), polystyrene (PS), polymer derivatives having phenol groups, acrylic polymer, imide-based polymer, aryl ether-based polymer, amide-based polymer, fluoride-based polymer, p-xylene-based polymer, vinyl alcohol-based polymer, or mixtures thereof.

A second connection electrode layer 1700 as shown in FIG. 13 may be located on the first planarized insulating layer 121. The second connection electrode layer 1700 may include a horizontal connection line 1710, a seventh transmission line 1720, an eighth transmission line 1760, and a ninth transmission line 1770.

The horizontal connection line 1710 may extend in the first direction (x-axis direction). The horizontal connection line 1710 may be one of the first horizontal connection line HCL1 and/or the second horizontal connection line HCL2, which have been described above with reference to FIG. 4, according to the position of a pixel. That is, the first horizontal connection line HCL1 and the second horizontal connection line HCL2 may be located on (or at) the same layer.

The seventh transmission line 1720 may be electrically connected to the second transmission line 1620 through a contact hole 1720CNT. The data signal Dm from the data line 1810 that will be described below with reference to FIG. 14 may be transmitted to the first semiconductor layer 1100 through the seventh transmission line 1720 and the second transmission line 1620, and may be applied to the switching transistor T2.

The eighth transmission line 1760 may extend in the first direction (x-axis direction). The driving voltage ELVDD from a driving voltage line 1830 that will be described below with reference to FIG. 14 may be transmitted to the eighth transmission line 1760, and the eighth transmission line 1760 electrically connected to the first semiconductor layer 1100 through a contact hole 1760CNT1 may be configured to transmit the driving voltage ELVDD to the first semiconductor layer 1100, for example, to the operation control transistor T5. Also, the eighth transmission line 1760 electrically connected to the capacitor upper electrode 1330 (e.g., the second capacitor electrode CE2 of FIG. 5) through a contact hole 1760CNT may be configured to transmit the driving voltage ELVDD to the capacitor upper electrode 1330.

The ninth transmission line 1770 may be electrically connected to the fifth transmission line 1670 through a contact hole 1770CNT. The ninth transmission line 1770 may be configured to receive the driving current or the second initialization voltage Vint2 from the first semiconductor layer 1100 through the fifth transmission line 1670, and to transmit the driving current or the second initialization voltage Vint2 to the organic light-emitting diode OLED.

The second connection electrode layer 1700 may include a metal, an alloy, a conductive metal oxide, or a transparent conductive material. For example, the second connection electrode layer 1700 may include Ag, an alloy including Ag, Mo, an alloy including Mo, Al, an alloy including Al such as AlN, W, WN, Cu, Ni, Cr, CrN, Ti, Ta, Pt, Sc, ITO, or IZO. The second connection electrode layer 1700 may have a multi-layered structure, for example, the second connection electrode layer 1700 may have a dual-layered structure including Ti/Al or a triple-layered structure including Ti/Al/Ti.

A second planarized insulating layer 123 (see FIG. 15) may cover the second connection electrode layer 1700, and may be located on the first planarized insulating layer 121. The second planarized insulating layer 123 may include an organic insulating material. For example, the second planarized insulating layer 123 may include photoresist, BCB, polyimide, HMDSO, PMMA, PS, polymer derivatives having phenol groups, acrylic polymer, imide-based polymer, aryl ether-based polymer, amide-based polymer, fluoride-based polymer, p-xylene-based polymer, vinyl alcohol-based polymer, or mixtures thereof.

A third connection electrode layer 1800 as shown in FIG. 14 may be located on the second planarized insulating layer 123. The third connection electrode layer 1800 may include a data line 1810, a vertical connection line 1820, a driving voltage line 1830, and a tenth transmission line 1840.

The data line 1810 may extend in a second direction (y-axis direction). The data line 1810 may correspond to the data line DL of FIG. 5. In addition, the data line 1810 may be one of the first-first data line DL1-1, the first-second data line DL1-2, the second-first data line DL2-1, and/or the second-second data line DL2-2, which have been described above with reference to FIG. 4, according to the position of a pixel. That is, the first-first data line DL1-1, the first-second data line DL1-2, the second-first data line DL2-1, and the second-second data line DL2-2 may be located on (or at) the same layer.

The data line 1810 may be electrically connected to the seventh transmission line 1720 through a contact hole 1810CNT, and the data signal Dm from the data line 1810 may be transmitted to the first semiconductor layer 1100 through the seventh transmission line 1720 and the second transmission line 1620 and applied to the switching transistor T2.

The vertical connection line 1820 may extend substantially in the second direction (y-axis direction). The vertical connection line 1820 may be one of the first vertical connection line VCL1 and/or the second vertical connection line VCL2, which have been described above with reference to FIG. 4, according to the position of a pixel. That is, the first vertical connection line VCL1 and the second vertical connection line VCL2 may be located on (or at) the same layer.

The driving voltage line 1830 may extend substantially in the second direction (y-axis direction). The driving voltage line 1830 may correspond to the driving voltage line PL of FIG. 5. The driving voltage line 1830 may be configured to apply the driving voltage ELVDD to the pixels. The driving voltage line 1830 may be electrically connected to the eighth transmission line 1760 through a contact hole 1830CNT, and as described above, the driving voltage ELVDD may be transmitted to the operation control transistor T5 and to the capacitor upper electrode 1330. The driving voltage line 1830 of the first pixel circuit PC1 and the driving voltage line 1830 of the adjacent second pixel circuit PC2 may be integrally formed as a single body.

The tenth transmission line 1840 may be electrically connected to the ninth transmission line 1770 through a contact hole 1840CNT1, and may be configured to receive the driving current from the first semiconductor layer 1100 or the second initialization voltage Vint2 from the fifth transmission line 1670 and the ninth transmission line 1770. In addition, the tenth transmission line 1840 may be configured to transmit the driving current from the first semiconductor layer 1100 or the second initialization voltage Vint2, to the first electrode (pixel electrode) of the organic light-emitting diode OLED through a contact hole 1840CNT2 formed in the insulating layer located thereover.

The third connection electrode layer 1800 may include a metal, an alloy, a conductive metal oxide, or a transparent conductive material. For example, the third connection electrode layer 1800 may include Ag, an alloy including Ag, Mo, an alloy including Mo, Al, an alloy including Al such as AlN, W, WN, Cu, Ni, Cr, CrN, Ti, Ta, Pt, Sc, ITO, or IZO. The third connection electrode layer 1800 may have a multi-layered structure, for example, the third connection electrode layer 1800 may have a dual-layered structure including Ti/Al or a triple-layered structure including Ti/Al/Ti.

A third planarized insulating layer 125 as shown in FIG. 15 may cover the third connection electrode layer 1800, and may be located on the second planarized insulating layer 123. The third planarized insulating layer 125 may include an organic insulating material. For example, the third planarized insulating layer 125 may include photoresist, BCB, polyimide, HMDSO, PMMA, PS, polymer derivatives having phenol groups, acrylic polymer, imide-based polymer, aryl ether-based polymer, amide-based polymer, fluoride-based polymer, p-xylene-based polymer, vinyl alcohol-based polymer, or mixtures thereof.

The organic light-emitting diode OLED may be located on the third planarized insulating layer 125. The organic light-emitting diode OLED may include a pixel electrode 210, an intermediate layer 220 including an emission layer, and an opposite electrode 230.

The pixel electrode 210 may be a (semi-)transparent electrode or a reflective electrode. For example, the pixel electrode 210 may include a reflective layer including Ag, magnesium (Mg), Al, Pt, palladium (Pd), gold (Au), Ni, Nd, iridium (Ir), Cr, or compounds thereof, and a transparent or translucent electrode layer on the reflective layer. The transparent or translucent electrode layer may include ITO, IZO, zinc oxide (ZnO), indium oxide ($In_2O_3$), indium gallium oxide (IGO), or aluminum zinc oxide (AZO). For example, the pixel electrode 210 may have a triple-layered structure including ITO/Ag/ITO.

A pixel-defining layer 127 may be located on the third planarized insulating layer 125. The pixel-defining layer 127 increases a distance between an edge of the pixel electrode 210 and the opposite electrode 230 over the pixel electrode 210 to reduce or prevent the likelihood of an arc occurring at the edge of the pixel electrode 210.

The pixel-defining layer 127 may include one or more organic insulating materials selected from the group consisting of polyimide, polyamide, acryl resin, benzo cyclobutene, and phenol resin, and may be manufactured by a spin coating method, etc.

At least a portion of the intermediate layer 220 in the organic light-emitting diode OLED may be positioned in an opening OP formed by the pixel-defining layer 127. An emission area EA of the organic light-emitting diode OLED may be defined by the opening OP.

The intermediate layer 220 may include an emission layer. The emission layer may include an organic material including a fluorescent or phosphorescent material emitting red light, green light, blue light, or white light. The emission layer may include a low-molecular weight organic material or a polymer organic material, and functional layers, such as a hole transport layer (HTL), a hole injection layer (HIL), an electron transport layer (ETL), and an electron injection layer (EIL) may be selectively arranged under and over the emission layer.

The emission layer may be patterned to correspond to each of pixel electrodes 210. Other layers than the emission layer included in the intermediate layer 220 may be variously modified, for example, may be integrally provided over a plurality of pixel electrodes 210.

The opposite electrode 230 may be a transparent electrode or a reflective electrode. For example, the opposite electrode 230 may be a transparent or translucent electrode, and may include lithium (Li), calcium (Ca), Al, Ag, Mg, or compounds thereof, such as lithium fluoride (LiF). Alternatively, the opposite electrode 230 may further include a metal thin film and a transparent conductive oxide (TCO) layer, such as a layer including ITO, IZO, ZnO, or $In_2O_3$, over the metal thin film. The opposite electrode 230 may be integrally provided over the entire surface of the display area DA, and may be located on the intermediate layer 220 and the pixel-defining layer 127.

In the case of the first-first pixel Px1-1, the first-second pixel Px1-2, the second-first pixel Px2-1, the second-second pixel Px2-2, and the third pixel Px3 described above with reference to FIG. 4, the organic light-emitting diode OLED that is a display element may overlap a pixel circuit, and may be positioned over a pixel circuit, as shown in FIG. 15.

Figure 16:
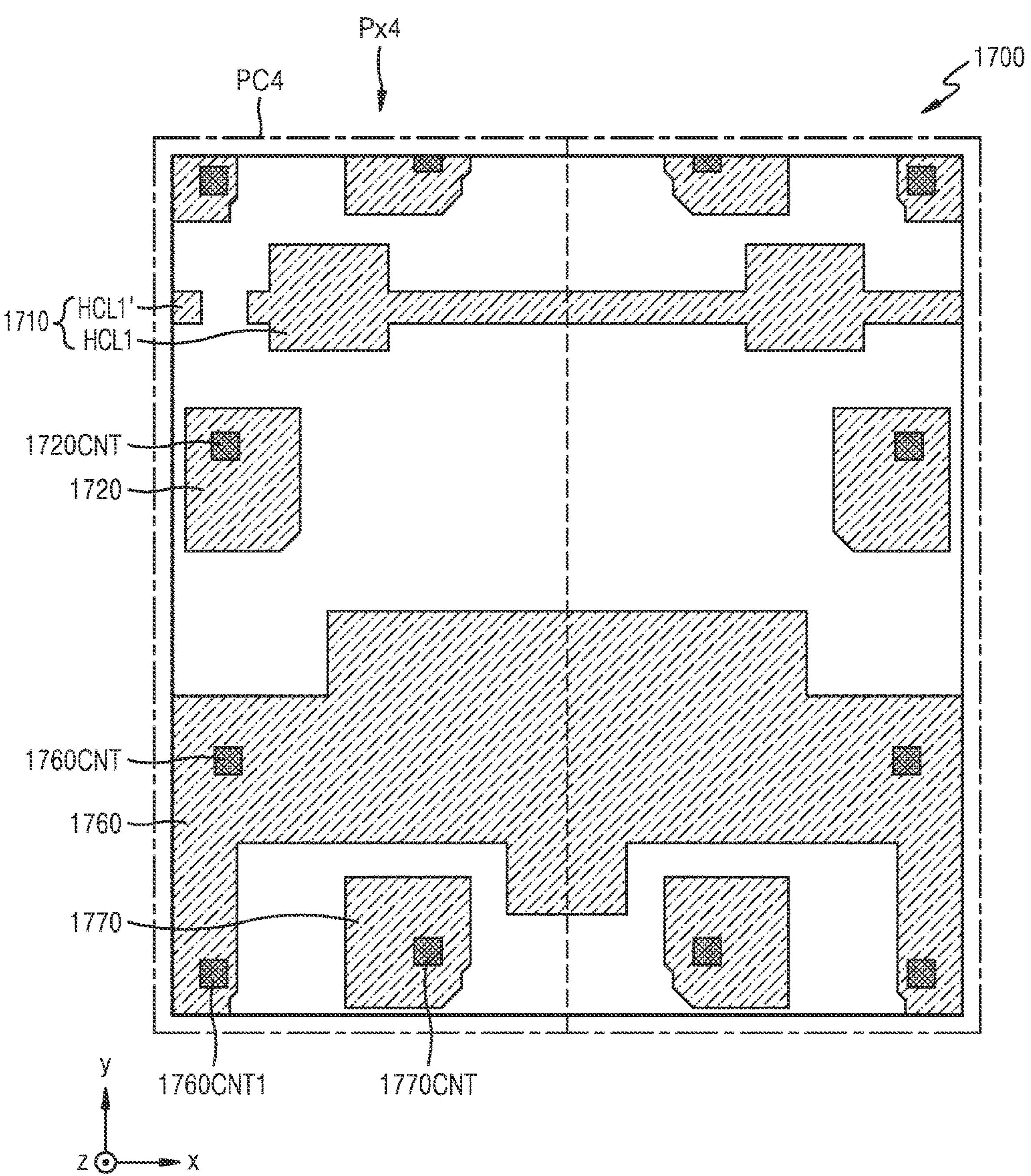
FIGS. 16 and 17 are schematic layout views of some of elements in a pixel of the display panel of FIG. 4.
Figure 17:
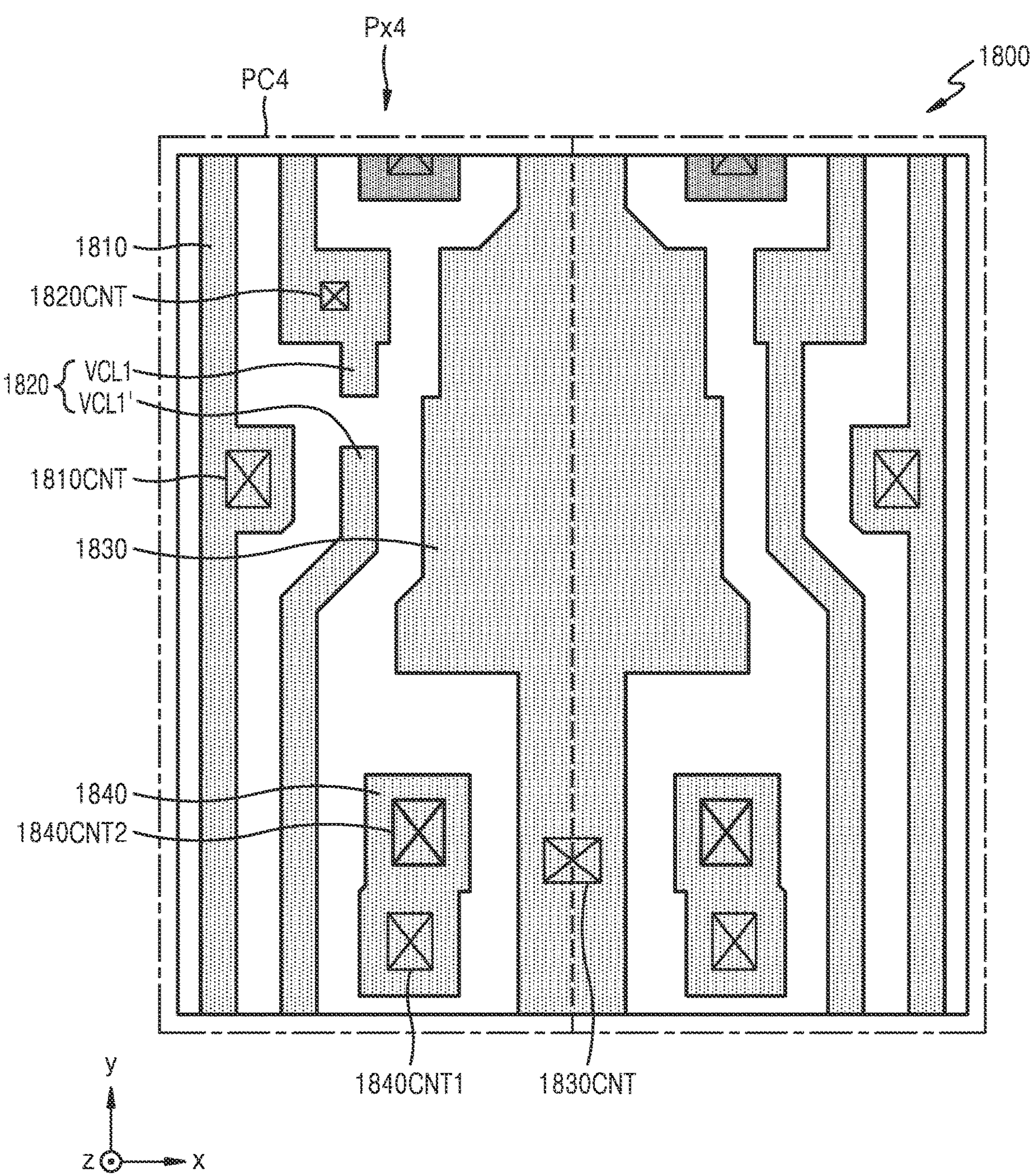

FIGS. 16 and 17 are schematic layout views of some of elements included in a fourth pixel circuit PC4 of the fourth pixel Px4 in the display panel 10 of FIG. 4.

In FIGS. 16 and 17, the fourth pixel Px4 is shown together with a pixel adjacent thereto in the second direction (x-axis direction) for convenience of description. At a point where the fourth pixel Px4 is positioned, the first vertical connection line VCL1 and the first horizontal connection line HCL1 are electrically connected to each other.

As shown in FIG. 16, the horizontal connection line 1710 is cut at the fourth pixel Px4. Accordingly, the horizontal connection line 1710 includes the first horizontal connection line HCL1 and the first dummy horizontal connection line HCL1' spaced apart from each other. Similarly, as shown in FIG. 17, the vertical connection line 1820 is cut at the fourth pixel Px4. Accordingly, the vertical connection line 1820 includes the first vertical connection line VCL1 and the first dummy vertical connection line VCL1' spaced apart from each other. The first vertical connection line VCL1 and the first horizontal connection line HCL1 are electrically connected to each other through a contact hole 1820CNT formed in an insulating layer therebetween. As described above, according to the position of a pixel in the display apparatus, the horizontal connection line 1710 may be disconnected, the vertical connection line 1820 may be disconnected, and the contact hole 1820CNT may be present within the corresponding pixel.

Figure 18:
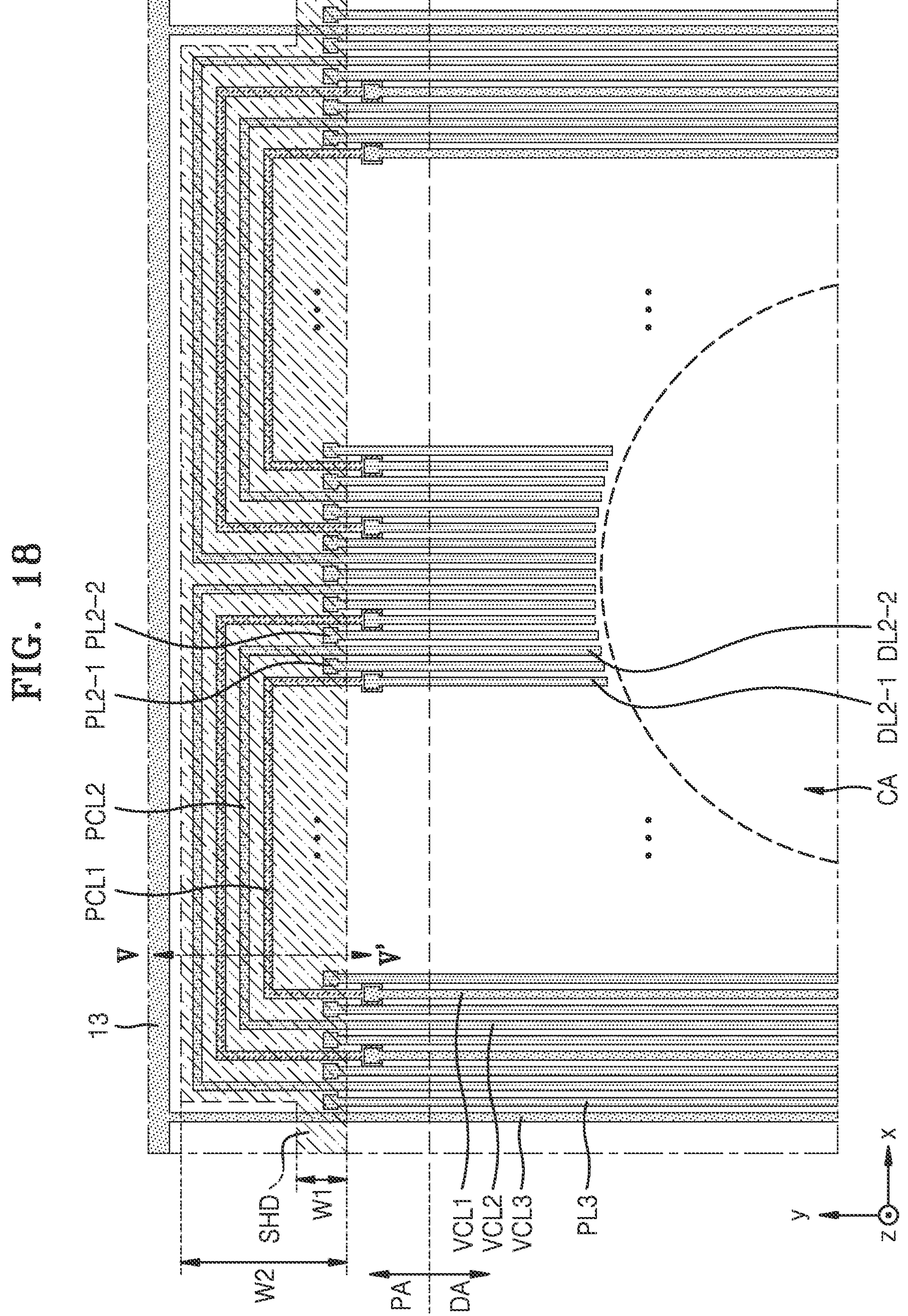
FIG. 18 is a schematic plan view of a region of a display panel that may be included in the display apparatus of FIG. 1.
Figure 19:
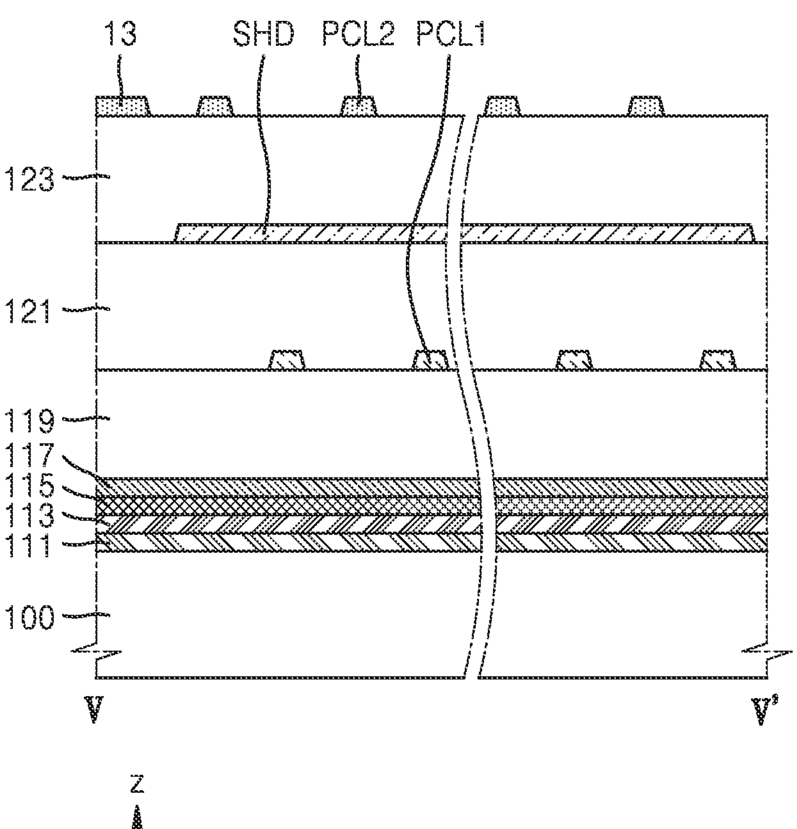
FIG. 19 is a schematic cross-sectional view of the display apparatus of FIG. 18, taken along the line V-V".

FIG. 18 is a schematic plan view of a region of a display panel that may be included in the display apparatus 1 of FIG. 1, and FIG. 19 is a schematic cross-sectional view of the display apparatus 1 of FIG. 18, taken along the line V-V'. In detail, FIG. 18 is a schematic plan view of a portion where the first peripheral connection line PCL1 and the second peripheral connection line PCL2 are positioned, and portions of the display area DA and the component area CA in the vicinity thereof.

As described above, one end of the first peripheral connection line PCL1 may be electrically connected to the first vertical connection line VCL1. In addition, the first peripheral connection line PCL1 may include a first portion extending substantially in the second direction (x-axis direction) and positioned in the peripheral area PA. FIG. 18 illustrates that the first peripheral connection line PCL1 includes the first portion extending substantially in the second direction (x-axis direction), and has a shape bent at both sides of the first portion. The other end of the first peripheral connection line PCL1 may be electrically connected to the second-first data line DL2-1. Similarly, one end of the second peripheral connection line PCL2 may be electrically connected to the second vertical connection line VCL2. In addition, the second peripheral connection line PCL2 may include a second portion extending substantially in the second direction (x-axis direction), and positioned in the peripheral area PA. FIG. 18 illustrates that the second peripheral connection line PCL2 includes the second portion extending substantially in the second direction (x-axis direction), and has a shape bent at both sides of the second portion. The other end of the second peripheral connection line PCL2 may be electrically connected to the second-second data line DL2-2.

The first peripheral connection line PCL1 may be included in, for example, the first connection electrode layer 1600 described above with reference to FIG. 12. That is, if the second transmission line 1620, the second initialization voltage line 1630, the third transmission line 1640, the fourth transmission line 1650, the fifth transmission line 1670, or the sixth transmission line 1680 is formed, the first peripheral connection line PCL1 may be concurrently or substantially simultaneously formed on (or at) the same layer with the same material as the aforementioned elements. As described above, the first peripheral connection line PCL1 may be located on a first insulating layer, and thus, the first insulating layer may be the second interlayer insulating layer 119. Accordingly, the first vertical connection line VCL1 on the second planarized insulating layer 123, which is a second insulating layer, may be electrically connected to the first peripheral connection line PCL1 on the second interlayer insulating layer 119 through a contact hole formed in the first planarized insulating layer 121 and the second planarized insulating layer 123.

The second peripheral connection line PCL2 may be included in, for example, the third connection electrode layer 1800 described above with reference to FIG. 14. That is, if the data line 1810, the vertical connection line 1820, the driving voltage line 1830, or the tenth transmission line 1840 is formed, the second peripheral connection line PCL2 may be concurrently or substantially simultaneously formed on (or at) the same layer with the same material as the aforementioned elements. As described above, the second peripheral connection line PCL2 may be located on the second insulating layer, and thus, the second insulating layer may be the second planarized insulating layer 123. Accordingly, the second peripheral connection line PCL2 may be integrally formed as a single body with the second vertical connection line VCL2, as shown in FIG. 18.

As described above, the shield layer SHD is between the first insulating layer and the second insulating layer, that is, between the second interlayer insulating layer 119 and the second planarized insulating layer 123. The first planarized insulating layer 121, referred to as a third insulating layer, may be between the first insulating layer and the second insulating layer, and the first planarized insulating layer 121 may cover the first peripheral connection line PCL1, etc. The shield layer SHD may be located on the third insulating layer, and may be between the third insulating layer and the second insulating layer. That is, the shield layer SHD may be included in the second connection electrode layer 1700 described above with reference to FIG. 13. Accordingly, the shield layer SHD may be located on the same layer on which the horizontal connection line 1710, such as the first horizontal connection line HCL1 and the second horizontal connection line HCL2 is located. That is, if the horizontal connection line 1710, the seventh transmission line 1720, the eighth transmission line 1760, and the ninth transmission line 1770 are formed, the shield layer SHD may be concurrently or substantially simultaneously formed on (or at) the same layer with the same material as the aforementioned elements. As described above, the shield layer SHD may be located on the first planarized insulating layer 121 covering the second interlayer insulating layer 119.

As shown in FIGS. 18 and 19, the first peripheral connection line PCL1 and the second peripheral connection line PCL2 adjacent to each other are located on (or at) different layers, and the shield layer SHD is between the first peripheral connection line PCL1 and the second peripheral connection line PCL2. Accordingly, electrical coupling between the first peripheral connection line PCL1 and the second peripheral connection line PCL2 may be efficiently prevented or significantly reduced.

Moreover, as shown in FIG. 19, the first peripheral connection line PCL1 and other peripheral connection lines are located on the second interlayer insulating layer 119, which is the first insulating layer. Also, the second peripheral connection line PCL2 and other peripheral connection lines are located on the second planarized insulating layer 123, which is the second insulating layer. Thus, when viewed from the direction (z-axis direction) perpendicular to the substrate 100, the first peripheral connection line PCL1 and the other peripheral connection lines on the first insulating layer may be alternately positioned with the second peripheral connection line PCL2 and the other peripheral connection lines on the second insulating layer. In addition, the shield layer SHD may be between the first peripheral connection line PCL1 and other peripheral connection lines on the first insulating layer, and the second peripheral connection line PCL2 and the other peripheral connection lines on the second insulating layer.

To ensure a shielding effect of the shield layer SHD between the first peripheral connection line PCL1 and the second peripheral connection line PCL2, when viewed from the direction (z-axis direction) perpendicular to the substrate 100, the shield layer SHD may overlap at least one of the first peripheral connection line PCL1 and/or the second peripheral connection line PCL2. To increase the shielding effect, when viewed from the direction (z-axis direction) perpendicular to the substrate 100, the shield layer SHD may overlap both the first peripheral connection line PCL1 and the second peripheral connection line PCL2.

In FIG. 18, intervals between lines (wires) are shown differently from actual intervals to show a connection structure between the lines (wires). However, actually, as shown in FIG. 4, an interval between data lines adjacent to each other in the second direction (x-axis direction), or an interval between vertical connection lines adjacent to each other in the second direction (x-axis direction), substantially corresponds to a width of a pixel in the second direction (x-axis direction), whereas an interval in the first direction (y-axis direction) between the first portion of the first peripheral connection line PCL1 extending in the second direction (x-axis direction) and the second portion of the second peripheral connection line PCL2 extending in the second direction (x-axis direction) may be much narrower than the width of the pixel in the second direction (x-axis direction). As a ratio of an area occupied by the display area DA in the display apparatus is increased by reducing an area of the peripheral area PA, the interval in the first direction (y-axis direction) between the first portion of the first peripheral connection line PCL1 extending in the second direction (x-axis direction) and the second portion of the second peripheral connection line PCL2 extending in the second direction (x-axis direction) may be further narrowed.

As described above, as the interval between the first portion of the first peripheral connection line PCL1 extending in the second direction (x-axis direction) and the second portion of the second peripheral connection line PCL2 extending in the second direction (x-axis direction) narrows, a possibility of electrical coupling occurring between the first portion and the second portion may increase. However, in the case of the display apparatus 1 according to one or more embodiments, when viewed from the direction (z-axis direction) perpendicular to the substrate 100, the shield layer SHD may overlap the first portion of the first peripheral connection line PCL1 extending in the second direction (x-axis direction), and also may overlap the second portion of the second peripheral connection line PCL2 extending in the second direction (x-axis direction). Accordingly, by preventing or significantly reducing electrical coupling between the first portion and the second portion, a display apparatus that displays a high-quality image may be implemented. For reference, a portion of the first peripheral connection line PCL1 shown in FIG. 19 is the first portion, and a portion of the second peripheral connection line PCL2 is the second portion. Accordingly, when viewed from the direction (z-axis direction) perpendicular to the substrate 100, the shield layer SHD may overlap the first portion and the second portion.

Moreover, to ensure that the shield layer SHD serves as a shield between the first portion of the first peripheral connection line PCL1 and the second portion of the second peripheral connection line PCL2, the shield layer SHD may be maintained at a constant potential. To this end, a potential of the shield layer SHD may become the driving voltage ELVDD. As shown in FIG. 14, the driving voltage line 1830 extending in the first direction (y-axis direction) may pass through the pixels. The driving voltage line 1830 is shown as the driving voltage line PL in FIG. 3. As shown in FIG. 3, one end of the driving voltage line 1830 or PL may be electrically connected to the driving voltage supply line 11 extending from the lower side of the display area DA in the second direction (x-axis direction) crossing the first direction. By connecting the other end of the driving voltage line 1830 or PL to the shield layer SHD, the potential of the shield layer SHD may become the driving voltage ELVDD.

In detail, in the case of the column in which the third pixel Px3 (e.g. refer to FIG. 4) is positioned, as described above with reference to FIGS. 4 and 18, the third data line DL3 extending in the first direction (y-axis direction) to pass through the corresponding column is not disconnected by the component area CA. Similarly, as shown in FIG. 18, a third driving voltage line PL3 extending in the first direction (y-axis direction) to pass through the corresponding column is not disconnected by the component area CA. Accordingly, one end of the third driving voltage line PL3 (in the −y direction) may be electrically connected to the driving voltage supply line 11. In addition, the other end of the third driving voltage line PL3 (in the +y direction) may be electrically connected to the shield layer SHD. Accordingly, the potential of the shield layer SHD may become the driving voltage ELVDD. A shape of the third driving voltage line PL3 may be similar to a shape of the third data line DL3 as shown in FIG. 4. Because the third driving voltage line PL3 is the driving voltage line 1830 as shown in FIG. 14, the third driving voltage line PL3 may be electrically connected to the shield layer SHD on the first planarized insulating layer 121 through a contact hole formed in the second planarized insulating layer 123 in the peripheral area PA.

Moreover, as shown in FIG. 18, a second-first driving voltage line PL2-1 may extend in the first direction (y-axis direction) and may be electrically connected to the shield layer SHD, the second-first driving voltage line PL2-1 being arranged in the display area DA to be on the other side of the component area CA (in +y direction) and being electrically connected to the second-first pixel circuit PC2-1 (e.g. refer to FIG. 4). Similarly, a second-second driving voltage line PL2-2 may extend in the first direction (y-axis direction) and may be electrically connected to the shield layer SHD, second-second driving voltage line PL2-2 being arranged in the display area DA to be on the other side of the component area CA (in +y direction) and being electrically connected to the second-second pixel circuit PC2-2 (e.g. refer to FIG. 4). Accordingly, the driving voltage ELVDD may be applied to the second-first pixel circuit PC2-1 and the second-second pixel circuit PC2-2.

Because the second-first driving voltage line PL2-1 is the driving voltage line 1830 as shown in FIG. 14, the second-first driving voltage line PL2-1 may be electrically connected to the shield layer SHD on the first planarized insulating layer 121 through a contact hole formed in the second planarized insulating layer 123 in the peripheral area PA. This also applies to the second-second driving voltage line PL2-2. For reference, the second-first driving voltage line PL2-1 and the second-second driving voltage line PL2-2 may have shapes similar to those of the second-first data line DL2-1 and the second-second data line DL2-2 of FIG. 4, except for being electrically connected by the first peripheral connection line PCL1 or the second peripheral connection line PCL2.

For reference, a first-first driving voltage line may extend in the first direction (y-axis direction), and may be electrically connected to the driving voltage supply line 11 (see FIG. 3), the first-first driving voltage line being arranged in the display area DA to be on one side of the component area CA (in the −y direction) and being electrically connected to the first-first pixel circuit PC1-1 (e.g. refer to FIG. 4). Similarly, a first-second driving voltage line may be electrically connected to the driving voltage supply line 11, the first-second driving voltage line being arranged in the display area DA to be on one side of the component area CA (in the −y direction) and being electrically connected to the first-second pixel circuit PC1-2 (e.g. refer to FIG. 4).

Moreover, as described above with reference to FIG. 3, the common voltage supply line 13 may have a loop shape having one side open to partially surround the display area DA (e.g., in plan view). Accordingly, as shown in FIG. 18, the common voltage supply line 13 may also be positioned in a portion of the peripheral area PA, positioned on the other side of the component area CA (in the +y direction). As described above with reference to FIG. 4, the third vertical connection line VCL3 extending in the first direction (y-axis direction) to pass through the third pixel circuit PC3 is not connected to other data lines. That is, the third vertical connection line VCL3 is not used to electrically connect data lines spaced apart from each other in the +y and −y directions of the component area CA in the first direction (y-axis direction). The third vertical connection line VCL3 may extend to the peripheral area PA, and may be electrically connected to the common voltage supply line 13. As described above, because a plurality of vertical connection lines electrically connected to the common voltage supply line 13 are present, a potential of the common voltage ELVSS may be maintained constant throughout the display area DA.

The common voltage supply line 13 may be included in the third connection electrode layer 1800 described above with reference to FIG. 14. That is, if the data line 1810, the vertical connection line 1820, the driving voltage line 1830, the tenth transmission line 1840, or the second peripheral connection line PCL2 is formed, the common voltage supply line 13 may be concurrently or substantially simultaneously formed on (or at) the same layer with the same material as the aforementioned elements. As described above, the second peripheral connection line PCL2 may be located on the second planarized insulating layer 123 that is the second insulating layer, and accordingly, the common voltage supply line 13 may be located on the second planarized insulating layer 123.

For reference, a third vertical connection line VCL3 is the vertical connection line 1820, and is located on the second planarized insulating layer 123. Accordingly, as shown in FIG. 18, the third vertical connection line VCL3 may be integrally formed as a single body with the common voltage supply line 13.

Moreover, as shown in FIG. 18, when viewed from the direction (z-axis direction) perpendicular to the substrate 100, the common voltage supply line 13 may be farther from the display area DA than the shield layer SHD. In addition, when viewed from the direction (z-axis direction) perpendicular to the substrate 100, a width W1 of a portion of the shield layer SHD overlapping the third vertical connection line VCL3 may be less than a width W2 of a portion of the shield layer SHD overlapping the first peripheral connection line PCL1 or the second peripheral connection line PCL2. Because the shield layer SHD is for preventing or significantly reducing electrical coupling between the first peripheral connection line PCL1 and the second peripheral connection line PCL2, it is suitable to widen the width W2 of the portion of the shield layer SHD overlapping the first peripheral connection line PCL1 or the second peripheral connection line PCL2. However, by reducing the width W1 of another portion of the shield layer SHD, for example, the portion of the shield layer SHD overlapping the third vertical connection line VCL3, generation of unexpected parasitic capacitance between other layers and the shield layer SHD may be significantly reduced.

Although the structure of the display apparatus has been described considering both pixels on one side of the component area CA (in the −y direction) and pixels on the other side of the component area CA (in the +y direction), one or more embodiments are not limited thereto. For example, a display apparatus considering only the pixels on the other side of the component area CA (in the +y direction) may also fall within the scope of the disclosure.

For example, the second-first pixel Px2-1 including the second-first pixel circuit PC2-1 and the second-first display element ED2-1 of FIG. 4 may be referred to as a first pixel, the second-second pixel Px2-2 including the second-second pixel circuit PC2-2 and the second-second display element ED2-2 may be referred to as a second pixel, the second-first data line DL2-1 may be referred to as a first data line, and the second-second data line DL2-2 may be referred to as a second data line.

In this case, the second-first pixel circuit PC2-1, which may be referred to as a first pixel circuit, and the second-second pixel circuit PC2-2, which may be referred to as a second pixel circuit, are arranged in the display area DA to be between the component area CA and the peripheral area PA. In addition, the second-first data line DL2-1, which may be referred to as a first data line, is arranged in the display area DA to be between the component area CA and the peripheral area PA, extends in the first direction (y-axis direction) from the component area CA toward the peripheral area PA, and is electrically connected to the first pixel circuit. The second-second data line DL2-2, which may be referred to as a second data line, is arranged in the display area DA to be between the component area CA and the peripheral area PA, extends in the first direction (y-axis direction) from the component area CA toward the peripheral area PA, and is electrically connected to the second pixel circuit.

The first peripheral connection line PCL1 may be electrically connected to the second-first data line DL2-1, which may be referred to as the first data line, include a first portion extending in the second direction (x-axis direction) from the peripheral area PA, and may be located on the second interlayer insulating layer 119 that is the first insulating layer. The second peripheral connection line PCL2 may be electrically connected to the second-second data line DL2-2, which may be referred to as the second data line, include a second portion extending in the second direction (x-axis direction) from the peripheral area PA, and may be located on the second planarized insulating layer 123 that is the second insulating layer located over the first insulating layer.

The shield layer SHD may have a portion between the first insulating layer and the second insulating layer. The first planarized insulating layer 121 that is the third insulating layer is between the first insulating layer and the second insulating layer, and covers the first peripheral connection line PCL1. The shield layer SHD may be between the first planarized insulating layer 121, which is the third insulating layer, and the second planarized insulating layer 123, which is the second insulating layer. When viewed from the direction (z-axis direction) perpendicular to the substrate 100, the shield layer SHD may overlap the first portion and the second portion.

Other descriptions described above may apply to all embodiments in which the second-first pixel Px2-1 is referred to as the first pixel, the second-second pixel Px2-2 is referred to as the second pixel, the second-first data line DL2-1 is referred to as the first data line, and the second-second data line DL2-2 is referred to as the second data line.

As described above, the disclosure has been described with reference to the one or more embodiments shown in the accompanying drawings, but should be considered in a descriptive sense only. Those of ordinary skill in the art will understand that various modifications and equivalent embodiments may be made therefrom. Therefore, the true technical scope of protection of the disclosure should be defined by the technical spirit of the appended claims.

According to the one or more embodiments described above, a display apparatus capable of displaying a high-quality image may be implemented. However, the scope of the disclosure is not limited by the above effects.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:

a substrate comprising a component area, a display area surrounding the component area in plan view, and a peripheral area outside the display area in plan view;

a first-first pixel circuit and a first-second pixel circuit in the display area on one side of the component area;

a second-first pixel circuit and a second-second pixel circuit in the display area on another side of the component area;

a first-first data line in the display area on the one side of the component area, extending in a first direction from the one side of the component area toward the component area, and electrically connected to the first-first pixel circuit;

a first-second data line in the display area on the one side of the component area, extending in the first direction, and electrically connected to the first-second pixel circuit;

a first horizontal connection line in the display area, extending in a second direction crossing the first direction, and electrically connected to the first-first data line;

a second horizontal connection line in the display area, extending in the second direction, and electrically connected to the first-second data line;

a first vertical connection line electrically connected to the first horizontal connection line, and extending in the first direction into the peripheral area;

a second vertical connection line electrically connected to the second horizontal connection line, and extending in the first direction into the peripheral area;

a first peripheral connection line above a first insulating layer, electrically connected to the first vertical connection line, and comprising a first portion extending in the second direction in the peripheral area;

a second peripheral connection line above a second insulating layer, electrically connected to the second vertical connection line, and comprising a second portion extending in the second direction in the peripheral area;

a second-first data line in the display area on the other side of the component area, extending in the first direction to be electrically connected to the first peripheral connection line, and electrically connected to the second-first pixel circuit;

a second-second data line in the display area on the other side of the component area, extending in the first direction to be electrically connected to the second peripheral connection line, and electrically connected to the second-second pixel circuit; and a shield layer comprising a portion between the first insulating layer and the second insulating layer in the peripheral area.

2. The display apparatus of claim 1, wherein the shield layer overlaps the first peripheral connection line and/or the second peripheral connection line.

3. The display apparatus of claim 1, wherein the shield layer overlaps the first peripheral connection line and the second peripheral connection line.

4. The display apparatus of claim 1, wherein the shield layer overlaps the first portion and the second portion.

5. The display apparatus of claim 1, wherein the second insulating layer is above the first insulating layer.

6. The display apparatus of claim 5, further comprising a third insulating layer between the first insulating layer and the second insulating layer, and covering the first peripheral connection line.

7. The display apparatus of claim 6, wherein the shield layer is between the third insulating layer and the second insulating layer.

8. The display apparatus of claim 1, further comprising:

a third pixel circuit in the display area to be in the second direction from the component area;

a third data line extending in the first direction, and electrically connected to the third pixel circuit;

a common voltage supply line in the peripheral area, and electrically connected to an opposite electrode over the display area; and a third vertical connection line extending in the first direction, passing through the third pixel circuit, and electrically connected to the common voltage supply line.

9. The display apparatus of claim 8, wherein the common voltage supply line and the second peripheral connection line are at a same layer.

10. The display apparatus of claim 8, wherein the third vertical connection line and the second peripheral connection line are at a same layer.

11. The display apparatus of claim 10, wherein the third vertical connection line and the common voltage supply line are integrally formed as a single body.

12. The display apparatus of claim 8, wherein the common voltage supply line is farther from the display area than the shield layer in plan view.

13. The display apparatus of claim 8, wherein, in plan view, a width of a portion of the shield layer that overlaps the third vertical connection line is less than a width of a portion of the shield layer that overlaps the first peripheral connection line or the second peripheral connection line.

14. The display apparatus of claim 1, further comprising:

a second-first driving voltage line in the display area on the other side of the component area, extending in the first direction to be electrically connected to the shield layer, and electrically connected to the second-first pixel circuit; and a second-second driving voltage line in the display area on the other side of the component area, extending in the first direction to be electrically connected to the shield layer, and electrically connected to the second-second pixel circuit.

15. The display apparatus of claim 1, further comprising:

a driving voltage supply line in the peripheral area on the one side of the component area;

a first-first driving voltage line in the display area on the one side of the component area, extending in the first direction to be electrically connected to the driving voltage supply line, and electrically connected to the first-first pixel circuit; and a first-second driving voltage line in the display area on the one side of the component area, extending in the first direction to be electrically connected to the driving voltage supply line, and electrically connected to the first-second pixel circuit.

16. The display apparatus of claim 1, wherein the shield layer, the first horizontal connection line, and the second horizontal connection line are at a same layer.

17. The display apparatus of claim 1, wherein the first-first pixel circuit and the second-first pixel circuit are in a same column extending in the first direction.

18. The display apparatus of claim 1, wherein the first-second pixel circuit and the second-second pixel circuit are in a same column extending in the first direction.

19. The display apparatus of claim 1, wherein the first-first data line, the first-second data line, the second-first data line, the second-second data line, the first vertical connection line, and the second vertical connection line are at a same layer.

20. A display apparatus comprising:

a substrate comprising a component area, a display area surrounding the component area in plan view, and a peripheral area outside the display area in plan view;

a first pixel circuit and a second pixel circuit in the display area between the component area and the peripheral area;

a first data line in the display area between the component area and the peripheral area, extending in a first direction from the component area toward the peripheral area, and electrically connected to the first pixel circuit;

a second data line in the display area between the component area and the peripheral area, extending in the first direction, and electrically connected to the second pixel circuit;

a first peripheral connection line above a first insulating layer, electrically connected to the first data line, and comprising a first portion extending in a second direction in the peripheral area, the second direction crossing the first direction;

a second peripheral connection line above a second insulating layer, electrically connected to the second data line, and comprising a second portion extending in the second direction in the peripheral area; and a shield layer comprising a portion between the first insulating layer and the second insulating layer in the peripheral area.

21. The display apparatus of claim 20, wherein the shield layer overlaps the first portion and the second portion.

22. The display apparatus of claim 20, wherein the second insulating layer is above the first insulating layer.

23. The display apparatus of claim 22, further comprising a third insulating layer between the first insulating layer and the second insulating layer, and covering the first peripheral connection line.

24. The display apparatus of claim 23, wherein the shield layer is between the third insulating layer and the second insulating layer.

* * * * *